United States Patent
Yamazaki et al.

(10) Patent No.: US 9,287,117 B2
(45) Date of Patent: *Mar. 15, 2016

(54) SEMICONDUCTOR DEVICE COMPRISING AN OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Setagaya (JP); Hideomi Suzawa, Atsugi (JP); Shinya Sasagawa, Chigasaki (JP); Tetsuhiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

This patent is subject to a terminal disclaimer.

(21) Appl. No.: 14/054,078

(22) Filed: Oct. 15, 2013

(65) Prior Publication Data
US 2014/0103337 A1 Apr. 17, 2014

(30) Foreign Application Priority Data
Oct. 17, 2012 (JP) ................................. 2012-230365

(51) Int. Cl.
*H01L 29/786* (2006.01)
*H01L 21/02* (2006.01)
*H01L 29/78* (2006.01)
*H01L 29/66* (2006.01)
*H01L 29/26* (2006.01)

(52) U.S. Cl.
CPC .... *H01L 21/02565* (2013.01); *H01L 21/02617* (2013.01); *H01L 29/66969* (2013.01);
(Continued)

(58) Field of Classification Search
CPC ............ H01L 27/1225; H01L 29/7869; H01L 29/78696
USPC ........................................................... 257/43
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 102646716 8/2012
EP 1737044 A 12/2006
(Continued)

OTHER PUBLICATIONS

U.S. Appl. No. 14/054,130.*
(Continued)

*Primary Examiner* — John C Ingham
(74) *Attorney, Agent, or Firm* — Eric J. Robinson; Robinson Intellectual Property Law Office, P.C.

(57) ABSTRACT

To provide a highly reliable semiconductor device including an oxide semiconductor by suppression of change in its electrical characteristics. Oxygen is supplied from a base insulating layer provided below an oxide semiconductor layer and a gate insulating layer provided over the oxide semiconductor layer to a region where a channel is formed, whereby oxygen vacancies which might be generated in the channel are filled. Further, extraction of oxygen from the oxide semiconductor layer by a source electrode layer or a drain electrode layer in the vicinity of the channel formed in the oxide semiconductor layer is suppressed, whereby oxygen vacancies which might be generated in a channel are suppressed.

20 Claims, 25 Drawing Sheets

(52) U.S. Cl.
CPC ............ *H01L29/78* (2013.01); *H01L 29/7869* (2013.01); *H01L 29/78693* (2013.01); *H01L 29/78696* (2013.01); *H01L 29/26* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,884,360 B2 | 2/2011 | Takechi et al. |
| 7,994,579 B2 | 8/2011 | Itai |
| 8,148,779 B2 | 4/2012 | Jeong et al. |
| 8,203,143 B2 | 6/2012 | Imai |
| 8,420,442 B2 | 4/2013 | Takechi et al. |
| 8,823,092 B2 | 9/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0097844 A1 | 4/2011 | Takechi et al. |
| 2012/0132905 A1* | 5/2012 | Yamazaki ........................ 257/43 |
| 2012/0211755 A1 | 8/2012 | Fujimori et al. |
| 2013/0237012 A1 | 9/2013 | Takechi et al. |
| 2014/0103338 A1 | 4/2014 | Yamazaki et al. |
| 2014/0103340 A1 | 4/2014 | Yamazaki et al. |
| 2014/0106504 A1 | 4/2014 | Yamazaki et al. |
| 2014/0346507 A1 | 11/2014 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-042088 A | 2/2008 |
| JP | 2011-243745 | 12/2011 |
| JP | 2011-243745 A | 12/2011 |
| JP | 2012-134470 A | 7/2012 |
| JP | 2012-174723 A | 9/2012 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2005, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—AnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applies Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applies Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Parl.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID

(56) References Cited

OTHER PUBLICATIONS

Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp .1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or An] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett.(Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B.(Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCTJP2013/078115) Dated Jan. 21, 2014.

Written Opinion (Application No. PCTJP2013/078115) Dated Jan. 21, 2014.

* cited by examiner

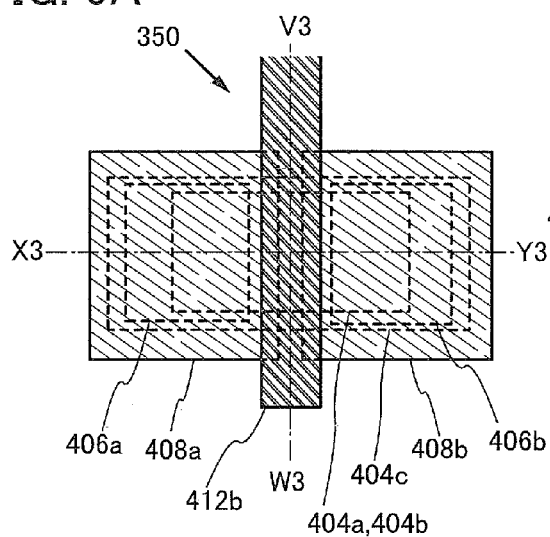
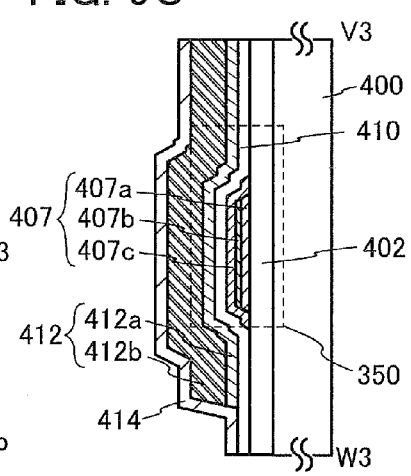
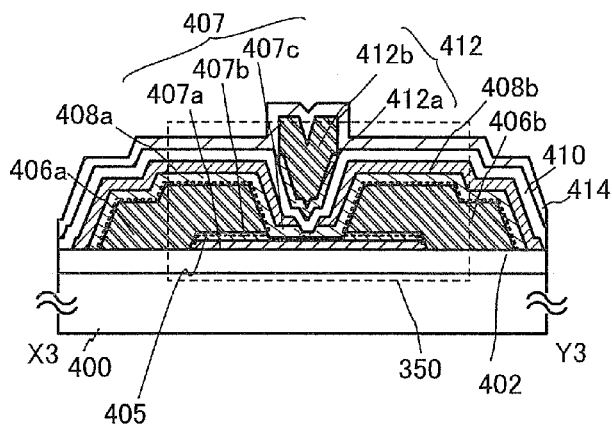

ly purified intrinsic oxide semiconductor layer. Note that in this specification and the like, in the case of the substantially purified oxide semiconductor layer, the carrier density thereof is lower than $1\times10^{17}/cm^3$, lower than $1\times10^{15}/cm^3$, or lower than $1\times10^{13}/cm^3$. By highly purifying the oxide semiconductor layer to be a highly purified intrinsic oxide semiconductor layer, the transistor can have stable electrical characteristics.

SEMICONDUCTOR DEVICE COMPRISING AN OXIDE SEMICONDUCTOR

TECHNICAL FIELD

One embodiment of the invention disclosed in this specification and the like relates to a semiconductor device and a method for fabricating the semiconductor device.

In this specification and the like, a semiconductor device refers to all types of devices which can function by utilizing semiconductor characteristics; an electro-optical device, an image display device, a semiconductor circuit, and an electronic device are all semiconductor devices.

BACKGROUND ART

A technique by which transistors are formed using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

An object of one embodiment of the present invention is to obtain a semiconductor device including an oxide semiconductor, which has favorable electrical characteristics.

Another object is to provide a highly reliable semiconductor device including an oxide semiconductor by suppression of a change in its electrical characteristics.

In the case of forming a transistor including an oxide semiconductor, an oxygen vacancy can be given as one of carrier supply sources of the oxide semiconductor. Many oxygen vacancies in an oxide semiconductor including a channel formation region of a transistor lead to generation of electrons in the channel formation region, which causes defects in electrical characteristics; for example, the transistor becomes normally-on, leakage current increases, or threshold voltage is shifted due to stress application. Further, in an oxide semiconductor layer, hydrogen, silicon, nitrogen, carbon, and a metal element except for that of a main component are impurities. For example, hydrogen in the oxide semiconductor layer forms a donor level, which increases carrier density. Silicon forms impurity levels in an oxide semiconductor layer. The impurity levels serve as traps and might cause electrical characteristics of the transistor to deteriorate.

Therefore, in order that a semiconductor device including an oxide semiconductor can have stable electrical characteristics, some measures need to be taken to reduce oxygen vacancies in the oxide semiconductor layer and to reduce the concentrations of impurities such as hydrogen and silicon.

In view of the foregoing, in a semiconductor device of one embodiment of the present invention, oxygen is supplied from a base insulating layer provided below an oxide semiconductor layer and a gate insulating layer provided over the oxide semiconductor layer to a region where a channel is formed, whereby oxygen vacancies which might be generated in the channel are filled. Further, extraction of oxygen from the oxide semiconductor layer by a source electrode layer or a drain electrode layer in the vicinity of the channel formed in the oxide semiconductor layer is suppressed, whereby an oxygen vacancy which may be generated in the channel is suppressed. Furthermore, a protective insulating layer serving as a barrier layer having a low hydrogen content and a low oxygen-transmitting property over a gate electrode layer is formed, so that oxygen is effectively supplied to the region where a channel is formed while desorption of oxygen from the gate insulating layer and/or the base insulating layer is suppressed.

Further, oxide layers containing one or more kinds of metal elements forming the oxide semiconductor layer are provided over and under and in contact with the oxide semiconductor layer where a channel is formed. Thus, the channel can be separate from the gate insulating layer. Further, an interface state is unlikely to be formed at the interface between the oxide semiconductor layer and each of the oxide layers, and thus fluctuation in electrical characteristics of the transistors, such as a threshold voltage, can be reduced.

In the semiconductor device of one embodiment of the present invention, which has the above-described structure, the concentration of an impurity in the oxide semiconductor layer serving as a channel (serving as a main carrier path) can be reduced so that the oxide semiconductor layer is highly purified to be a highly purified intrinsic oxide semiconductor layer. Obtaining a highly purified intrinsic oxide semiconductor layer refers to purifying or substantially purifying the oxide semiconductor layer to be an intrinsic or substantially intrinsic oxide semiconductor layer. Note that in this specification and the like, in the case of the substantially purified oxide semiconductor layer, the carrier density thereof is lower than $1\times10^{17}/cm^3$, lower than $1\times10^{15}/cm^3$, or lower than $1\times10^{13}/cm^3$. By highly purifying the oxide semiconductor layer to be a highly purified intrinsic oxide semiconductor layer, the transistor can have stable electrical characteristics.

Specifically, the following structure can be employed for example.

One embodiment of the present invention is a semiconductor device including a base insulating layer containing oxygen; an island-shaped oxide stack which is provided over the base insulating layer; a first source electrode layer and a first drain electrode layer each of which is in contact with a top surface of the island-shaped oxide stack and a side face thereof in a channel length direction; a second source electrode layer and a second drain electrode layer which are provided over the first source electrode layer and the first drain electrode layer, respectively, are in contact with the top surface of the oxide stack, and formed using a metal nitride film; a gate insulating layer which is provided over the second source electrode layer and the second drain electrode layer and in contact with the top surface of the oxide stack between the second source electrode layer and the second drain electrode layer; a gate electrode layer which overlaps with the oxide stack with the gate insulating layer provided therebetween; and a protective insulating layer which is provided over and in contact with the gate insulating layer and the gate electrode layer. The oxide stack includes an oxide semiconductor layer in which at least a channel is formed; a first oxide layer which is provided between the oxide semiconductor layer and the base insulating layer; and a second oxide layer which is provided between the oxide semiconductor layer and the gate insulating layer. The base insulating layer and the gate insulating layer are in contact with each other outside the island-shaped oxide stack. The protective insulating layer has a lower oxygen-transmitting property than the gate insulating layer.

Another embodiment of the present invention is a semiconductor device including a base insulating layer containing oxygen; an island-shaped oxide stack which is provided over the base insulating layer; a first source electrode layer and a first drain electrode layer each of which is in contact with a top surface of the island-shaped oxide stack and a side face thereof in a channel length direction; a second source electrode layer and a second drain electrode layer which are provided over the first source electrode layer and the first drain electrode layer, respectively, are in contact with the top surface of the oxide stack, and formed using a metal nitride film; a gate insulating layer which is provided over the second source electrode layer and the second drain electrode layer and is in contact with the top surface of the oxide stack between the second source electrode layer and the second drain electrode layer; a gate electrode layer which overlaps with the oxide stack, part of the second source electrode layer, and part of the second drain electrode layer with the gate insulating layer provided therebetween; and a protective insulating layer which is provided over and in contact with the gate insulating layer and the gate electrode layer. The oxide stack includes an oxide semiconductor layer in which at least a channel is formed; a first oxide layer which is provided between the oxide semiconductor layer and the base insulating layer; and a second oxide layer which is provided between the oxide semiconductor layer and the gate insulating layer. The base insulating layer and the gate insulating layer are in contact with each other outside the island-shaped oxide stack. The protective insulating layer has a lower oxygen-transmitting property than the gate insulating layer.

In any of the above semiconductor devices, it is preferable that the oxide semiconductor layer, the first oxide layer, and the second oxide layer be each formed using an In-M-Zn oxide (M is Al, Ti, Ga, Y, Zr, La, Ce, Nd, or Hf), and that an atomic ratio of M to In (hereinafter, also referred to as indium) in each of the first oxide layer and the second oxide layer be higher than that in the oxide semiconductor layer.

Further, in any of the above semiconductor devices, it is preferable that the oxide semiconductor layer include a crystal part and that a c-axis of the crystal part be parallel to a normal vector of a surface of the oxide semiconductor layer.

Further, in any of the above semiconductor devices, the first source electrode layer and the first drain electrode layer are each formed using a material which is bonded to oxygen more easily than a material used for the second source electrode layer and the second drain electrode layer.

Furthermore, in any of the above semiconductor devices, the concentration of hydrogen in the protective insulating layer is preferably lower than $5 \times 10^{19}$ cm$^{-3}$.

According to one embodiment of the present invention, a semiconductor device including an oxide semiconductor can have favorable electrical characteristics.

Further, according to one embodiment of the present invention, a highly reliable semiconductor device including an oxide semiconductor by suppression of a change in its electrical characteristics can be provided.

BRIEF DESCRIPTION OF THE DRAWINGS

In the accompanying drawings:

FIGS. 9A to 9C are a plan view and cross-sectional views illustrating one embodiment of a semiconductor device;

BEST MODE FOR CARRYING OUT THE INVENTION

Figure 1A:
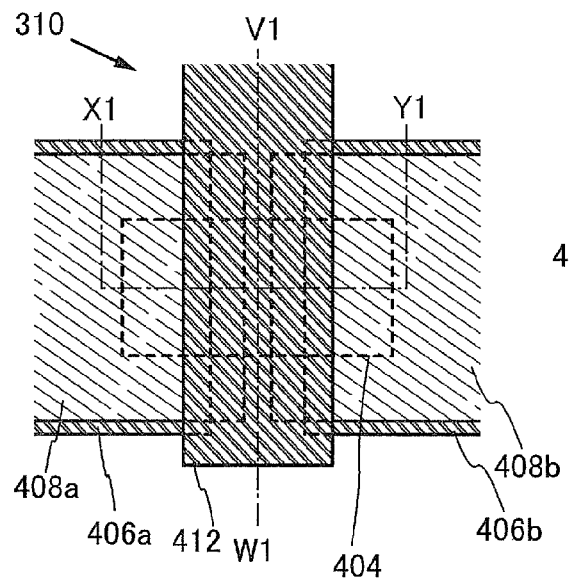
FIGS. 1A to 1D are a plan view and cross-sectional views illustrating one embodiment of a semiconductor device.

Hereinafter, embodiments and examples of the invention disclosed in this specification will be described with reference to the accompanying drawings. However, the invention disclosed in this specification is not limited to the following description, and it will be easily understood by those skilled in the art that modes and details thereof can be variously changed. Therefore, the invention disclosed in this specification is not construed as being limited to the description of the following embodiments and examples.

Note that in structures of one embodiment of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in this specification and the like, ordinal numbers such as "first" and "second" are used in order to avoid confusion among components and do not limit the number.

Note that functions of the source and the drain of a transistor may be switched in the case where transistors of different polarities are employed or in the case where the direction of a current flow changes in a circuit operation. Therefore, the terms "source" and "drain" can be used to denote the drain and the source, respectively, in this specification.

Embodiment 1

In this embodiment, a stacked-layer structure of a semiconductor device of one embodiment of the present invention will be described with reference to FIG. 10.

⟨Stacked-Layer Structure⟩

Figure 10:
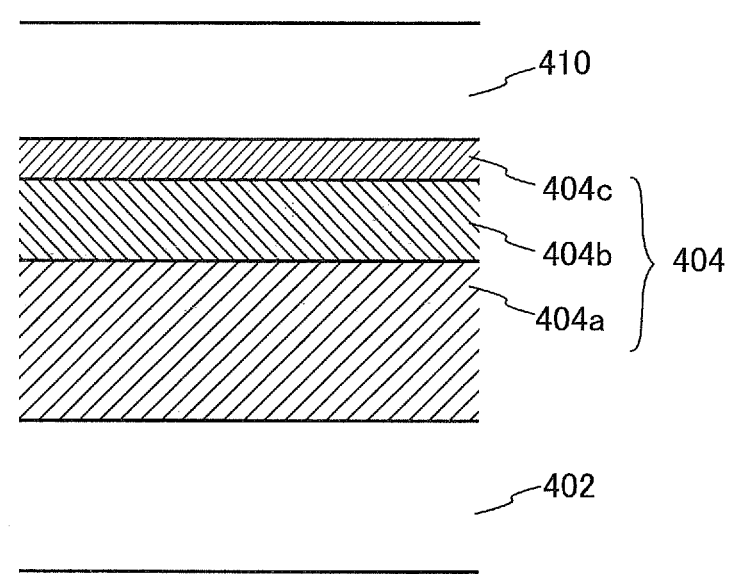
FIG. 10 is a conceptual view illustrating a stacked-layer structure of a transistor.

FIG. 10 is a conceptual view of an example of the stacked-layer structure.

The stacked-layer structure of the semiconductor device includes an oxide stack 404 between a base insulating layer 402 and a gate insulating layer 410. Further, the oxide stack 404 includes a first oxide layer 404a, an oxide semiconductor layer 404b, and a second oxide layer 404c.

Each of the first oxide layer 404a and the second oxide layer 404c is an oxide layer containing one or more kinds of metal elements which form the oxide semiconductor layer 404b.

The oxide semiconductor layer 404b includes a layer represented by an In-M-Zn oxide, which contains at least indium, zinc, and M (M is a metal element such as Al, Ga, Ge, Y, Zr, Sn, La, Ce, or Hf). The oxide semiconductor layer 404b preferably contains indium because the carrier mobility of a transistor is increased.

The first oxide layer 404a under the oxide semiconductor layer 404b includes an oxide layer which is represented by an In-M-Zn oxide (M is a metal element such as Al, Ti, Ga, Ge, Y, Zr, Sn, La, Ce, or Hf) and in which the atomic ratio of M to In is higher than that in the oxide semiconductor layer 404b. Specifically, the amount of any of the above elements in the first oxide layer 404a in an atomic ratio is 1.5 times or more, preferably 2 times or more, more preferably 3 times or more as much as that in the oxide semiconductor layer 404b in an atomic ratio. Any of the above elements is more strongly bonded to oxygen than indium, and thus has a function of suppressing generation of an oxygen vacancy in the oxide layer. That is, an oxygen vacancy is more unlikely to be generated in the first oxide layer 404a than in the oxide semiconductor layer 404b.

Further, the second oxide layer 404c over the oxide semiconductor layer 404b includes an oxide layer which is represented by an In-M-Zn oxide (M is a metal element such as Al, Ti, Ga, Ge, Y, Zr, Sn, La, Ce, or Hf) and in which the atomic ratio of M to In is higher than that in the oxide semiconductor layer 404b. Specifically, the amount of any of the above elements in the second oxide layer 404c in an atomic ratio is 1.5 times or more, preferably 2 times or more, more preferably 3 times or more as much as that in the oxide semiconductor layer 404b in an atomic ratio.

In other words, when each of the first oxide layer 404a, the oxide semiconductor layer 404b, and the second oxide layer 404c is an In-M-Zn oxide containing at least indium, zinc, and M (M is a metal element such as Al, Ti, Ga, Ge, Y, Zr, Sn, La, Ce, or Hf), and the first oxide layer 404a has an atomic ratio of In to M and Zn which is $x_1:y_1:z_1$, the oxide semiconductor layer 404b has an atomic ratio of In to M and Zn which is $x_2:y_2:z_2$, and the second oxide layer 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more, further preferably 3 times or more as large as $y_2/x_2$. At this time, when $y_2$ is greater than or equal to $x_2$ in the oxide semiconductor layer 404b, a transistor can have stable electrical characteristics. However, when $y_2$ is 3 times or more as great as $x_2$, the field-effect mobility of the transistor is reduced; accordingly, $y_2$ is preferably equal to $x_2$ or less than 3 times $x_2$.

Note that when the first oxide layer 404a is an In-M-Zn oxide, it is preferable that, in the atomic ratio between In and M, the proportion of In be less than 50 atomic % and the proportion of M be greater than or equal to 50 atomic %, and it is more preferable that, in the atomic ratio between In and M, the proportion of In be less than 25 atomic % and the proportion of M be greater than or equal to 75 atomic %. When the oxide semiconductor layer 404b is an In-M-Zn oxide, it is preferable that, in the atomic ratio between In and M, the proportion of In be greater than or equal to 25 atomic % and the proportion of M be less than 75 atomic %, and it is more preferable that, in the atomic ratio between In and M, the proportion of In be greater than or equal to 34 atomic % and the proportion of M be less than 66 atomic %. When the second oxide layer 404c is an In-M-Zn oxide, it is preferable that, in the atomic ratio between In and M, the proportion of In be less than 50 atomic % and the proportion of M be greater than or equal to 50 atomic %, and it is more preferable that, in the atomic ratio between In and M, the concentration of In be less than 25 atomic % and the proportion of M be greater than or equal to 75 atomic %.

The constituent elements of the first oxide layer 404a and the second oxide layer 404c may be different from each other, or their constituent elements may be the same at the same atomic ratios or different atomic ratios.

For the first oxide layer 404a, the oxide semiconductor layer 404b, and the second oxide layer 404c, for example, an oxide semiconductor containing indium, zinc, and gallium can be used.

The thickness of the first oxide layer 404a is greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm.

It is preferable that each of the first oxide layer 404a and the second oxide layer 404c contain one or more kinds of metal elements forming the oxide semiconductor layer 404b and be formed using an oxide semiconductor whose bottom of the conduction band is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less in an energy between the vacuum level and the bottom of the conduction band.

In such a structure, when a voltage is applied to a gate electrode layer overlapping with the oxide stack 404 with the gate insulating layer 410 provided therebetween, a channel is formed in the oxide semiconductor layer 404b of the oxide stack 404, whose energy at the bottom of the conduction band is the lowest. In other words, the second oxide layer 404c is formed between the oxide semiconductor layer 404b and the gate insulating layer 410, whereby a structure in which the channel of the transistor is not in contact with the gate insulating layer 410 can be obtained.

⟨Band Structure of Oxide Stack⟩

A band structure of the oxide stack 404 is described. A stack corresponding to the oxide stack 404 in which an In—Ga—Zn oxide having an energy gap of 3.15 eV is used as a layer corresponding to each of the first oxide layer 404a and the second oxide layer 404c and an In—Ga—Zn oxide having an energy gap of 2.8 eV is used as a layer corresponding to the oxide semiconductor layer 404b is fabricated, and the band structure thereof is analyzed. Note that for convenience, the stack is referred to as an oxide stack, and the layers forming the stack are referred to as a first oxide layer, an oxide semiconductor layer, and a second oxide layer.

The thickness of each of the first oxide layer, the oxide semiconductor layer, and the second oxide layer was 10 nm. The energy gap was measured with use of a spectroscopic ellipsometer (UT-300 manufactured by HORIBA Jobin Yvon). Further, the energy gap in the vicinity of an interface between the first oxide layer and the oxide semiconductor layer was 3 eV, and the energy gap in the vicinity of an interface between the second oxide layer and the oxide semiconductor layer was 3 eV.

Figure 6A:
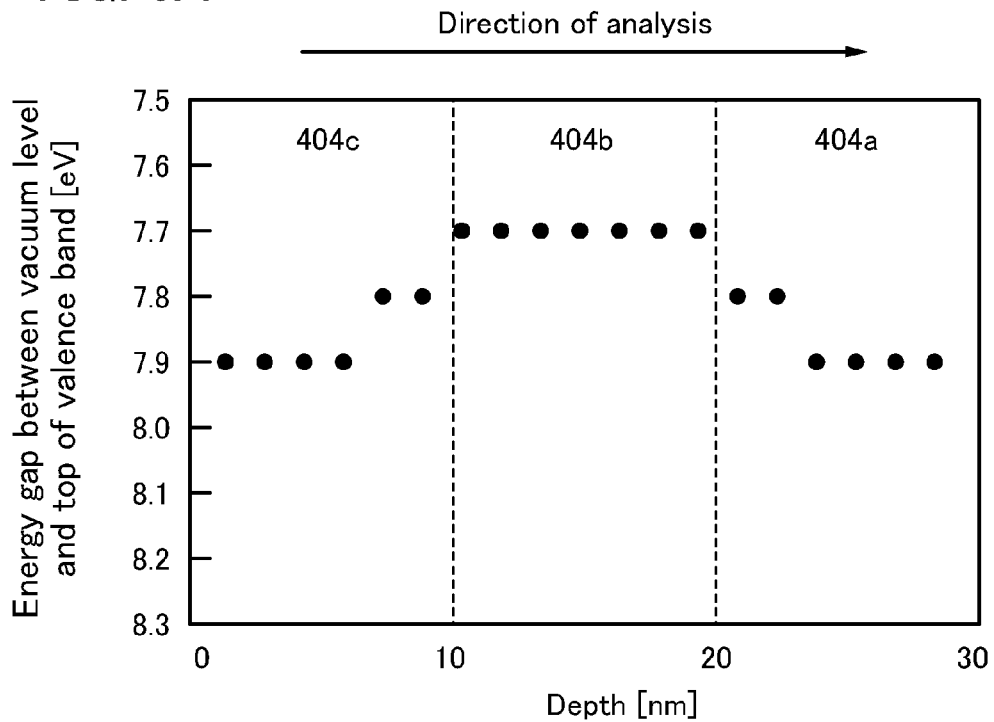
FIGS. 6A and 6B illustrate a band structure of an oxide stack.

In FIG. 6A, the energy difference between a vacuum level and a top of a valence band of each layer was measured while the oxide stack was etched from the second oxide layer side, and was plotted. The energy difference between the vacuum level and the top of the valence band was measured using an ultraviolet photoelectron spectroscopy (UPS) device (VersaProbe manufactured by ULVAC-PHI, Inc.).

Figure 6B:
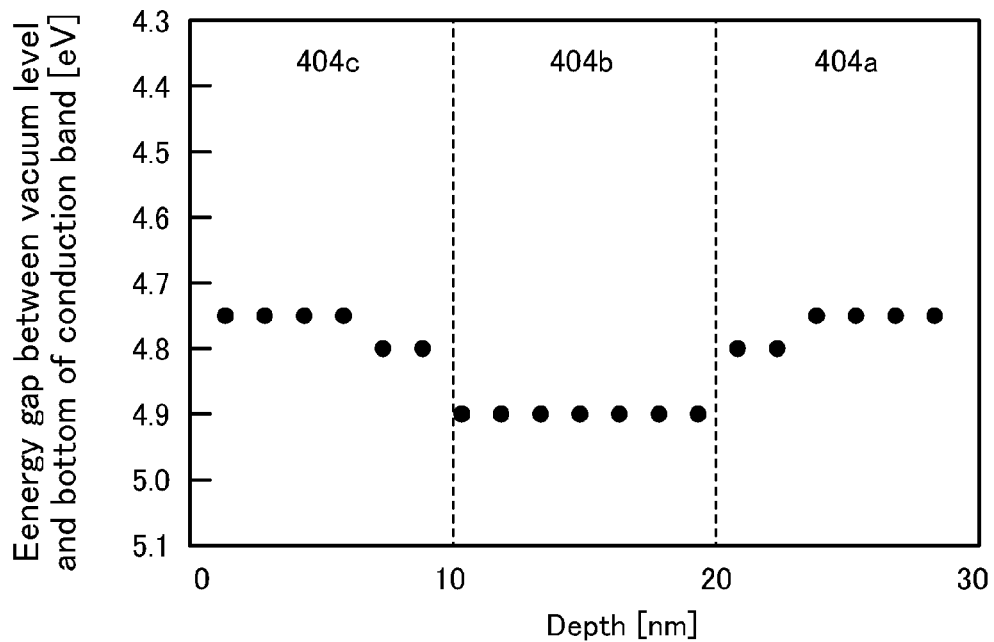

In FIG. 6B, an energy difference (electron affinity) between the vacuum level and a bottom of a conduction band of each layer, which was calculated by subtracting the energy gap of each layer from the energy difference between the vacuum level and the top of the valence band, was plotted.

Figure 7A:
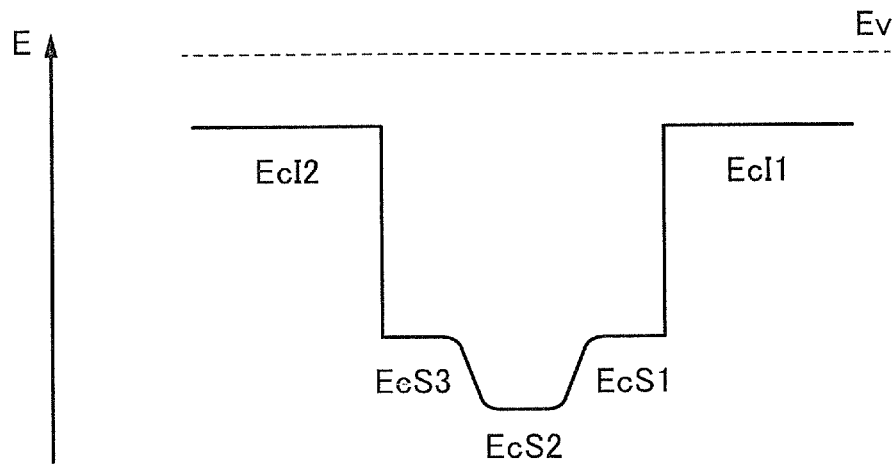
FIGS. 7A and 7B illustrate a band structure of an oxide stack.

Part of the band structure in FIG. 6B is schematically shown in FIG. 7A. FIG. 7A shows the case where silicon oxide films are provided in contact with the first oxide layer and the second oxide layer. Here, Ev represents energy of the vacuum level, EcI1 and EcI2 represent energy at the bottom of the conduction band of the silicon oxide film, EcS1 represents energy at the bottom of the conduction band of the first oxide layer, EcS2 represents energy at the bottom of the conduction band of the oxide semiconductor layer, and EcS3 represents energy at the bottom of the conduction band of the second oxide layer.

As shown in FIG. 7A, the energies of the bottoms of the conduction bands of the first oxide layer, the oxide semiconductor layer, and the second oxide layer are changed continuously. This can be understood also from the fact that the compositions of the first oxide layer, the oxide semiconductor layer, and the second oxide layer are close to each other and oxygen is easily diffused through the interface between the first oxide layer and the oxide semiconductor layer and through the interface between the oxide semiconductor layer and the second oxide layer.

Figure 7B:
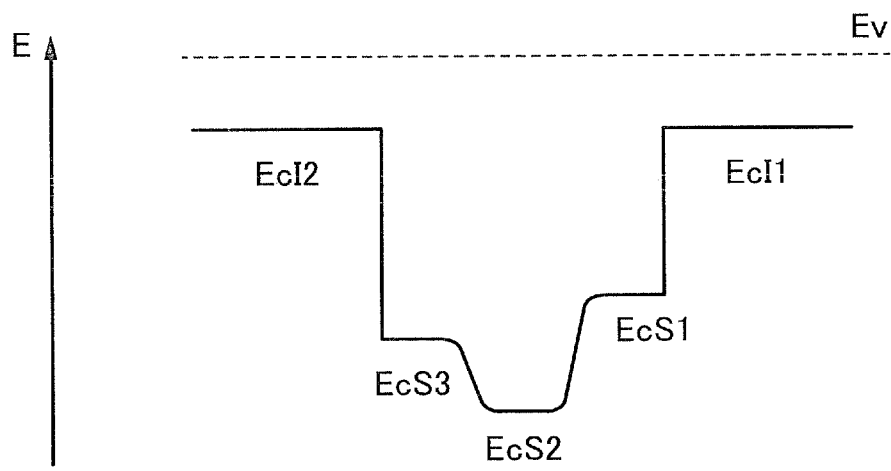

Note that although the case where the first oxide layer and the second oxide layer are oxide layers having the same energy gap is shown in FIG. 7A, the first oxide layer and the second oxide layer may be oxide layers having different energy gaps. For example, part of the band structure in the case where EcS1 is higher than EcS3 is shown in FIG. 7B. Alternatively, although not shown in FIGS. 7A and 7B, EcS3 may be higher than EcS1.

According to FIGS. 6A and 6B and FIGS. 7A and 7B, the oxide semiconductor layer of the oxide stack serves as a well and a channel of the transistor including the oxide stack is formed in the oxide semiconductor layer. Note that since the energies of the bottoms of the conduction bands are changed continuously, the oxide stack can also be referred to as a U-shaped well. Further, a channel formed to have such a structure can also be referred to as a buried channel.

Since each of the first oxide layer 404a and the second oxide layer 404c is an oxide layer containing one or more kinds of metal elements forming the oxide semiconductor layer 404b, the oxide stack 404 can also be referred to as an oxide stack in which layers containing the same main components are stacked. The oxide stack in which layers containing the same main components are stacked is formed to have not only a simple stacked-layer structure of the layers but also a continuous energy band (here, in particular, a well structure having a U shape in which energies of the bottoms of the conduction bands are changed continuously between the layers). This is because when a defect level or an impurity for an oxide semiconductor, for example, a defect level such as a trapping center or a recombination center, or an impurity forming a barrier which inhibits the flow of carriers is mixed at an interface between the layers, the continuity of the energy band is lost, and thus carriers are trapped or disappear by recombination at the interface.

In order to form a continuous energy band, the layers needs to be stacked successively without exposure to the air with the use of a multi-chamber deposition apparatus (a sputtering apparatus) including a load lock chamber. Each chamber in the sputtering apparatus is preferably subjected to high vacuum evacuation (to a vacuum of about $1\times10^{-4}$ Pa to $5\times10^{-7}$ Pa) with use of a suction vacuum evacuation pump such as a cryopump in order to remove water or the like which is an impurity for an oxide semiconductor as much as possible. Alternatively, a turbo-molecular pump is preferably used in combination with a cold trap so that a gas does not flow backward from an evacuation system to a chamber.

In order to obtain a highly purified intrinsic oxide semiconductor, a chamber needs to be subjected to high vacuum evacuation, and in addition, a sputtering gas needs to be highly purified. When a highly purified gas having a dew point of −40° C. or lower, preferably −80° C. or lower, more preferably −100° C. or lower is used as an oxygen gas or an argon gas used as a sputtering gas, moisture or the like can be prevented from entering an oxide semiconductor as much as possible.

The first oxide layer 404a and the second oxide layer 404c which are provided over and under the oxide semiconductor layer 404b each serve as a barrier layer and can prevent a trap level formed at an interface between the oxide stack 404 and each of the insulating layers which are in contact with the oxide stack 404 (the base insulating layer 402 and the gate insulating layer 410) from adversely affecting the oxide semiconductor layer 404b which serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. The oxide layers in which oxygen vacancies are less likely to be generated than in the oxide semiconductor layer 404b are provided over and under and in contact with the oxide semiconductor layer 404b in the oxide stack 404, whereby oxygen vacancies in the oxide semiconductor layer 404b can be reduced. For example, in the oxide semiconductor layer 404b, the absorption coefficient due to the localized levels, which is obtained by measurement by a constant photocurrent method (CPM) is set lower than $1\times10^{-3}$/cm, preferably lower than $1\times10^{-4}$/cm.

Further, in the case where the oxide semiconductor layer 404b is in contact with an insulating layer including a different constituent element (e.g. a base insulating layer including a silicon oxide film), an impurity element (e.g., silicon) might be mixed into the oxide semiconductor layer 404b where a channel is formed. When an interface state is formed at an interface between the oxide semiconductor layer 404b and the insulating layer by the mixed impurity element, decrease in electrical characteristics of the transistor, such as a change in a threshold voltage of the transistor, is caused. However, since the first oxide layer 404a contains one or more kinds of metal elements forming the oxide semiconductor layer 404b in the oxide stack 404, an interface state is less likely to be formed at an interface between the first oxide layer 404a and the oxide semiconductor layer 404b. Thus, providing the first oxide layer 404a makes it possible to reduce fluctuation in the electrical characteristics of the transistor, such as threshold voltage.

In the case where a channel is formed at a vicinity of an interface between the gate insulating layer 410 and the oxide semiconductor layer 404b, interface scattering occurs at the interface and the field-effect mobility of the transistor is decreased. However, since the second oxide layer 404c contains one or more kinds of metal elements forming the oxide semiconductor layer 404b in the oxide stack 404, scattering of carriers is less likely to occur at an interface between the second oxide layer 404c and the oxide semiconductor layer 404b, and thus the field-effect mobility of the transistor can be increased.

Further, the first oxide layer 404a and the second oxide layer 404c each also serve as a barrier layer which suppresses formation of an impurity level due to the entry of the constituent elements of the insulating layers which are in contact with the oxide stack 404 (the base insulating layer 402 and the gate insulating layer 410) into the oxide semiconductor layer 404b.

For example, in the case of using a silicon-containing insulating layer as each of the base insulating layer 402 and the gate insulating layer 410 which are in contact with the oxide stack 404, the silicon in the insulating layers or carbon which might be contained in the insulating layers enters the first oxide layer 404a or the second oxide layer 404c at a depth of several nanometers from the interface in some cases. An impurity such as silicon, carbon, or the like entering the oxide semiconductor layer forms impurity levels. The impurity levels serve as a donor and generate an electron, so that the oxide semiconductor layer may become n-type.

However, when the thickness of the first oxide layer 404a and the second oxide layer 404c is larger than several nanometers, the impurity such as silicon or carbon does not reach the oxide semiconductor layer 404b, so that the influence of impurity levels is suppressed.

Here, the concentration of silicon in the oxide semiconductor layer is lower than or equal to $3\times10^{18}/cm^3$, preferably lower than or equal to $3\times10^{17}/cm^3$. In addition, the concentration of carbon in the oxide semiconductor layer is lower than or equal to $3\times10^{18}/cm^3$, preferably lower than or equal to $3\times10^{17}/cm^3$. It is particularly preferable to sandwich or surround the oxide semiconductor layer 404b serving as a carrier path by the first oxide layer 404a and the second oxide layer 404c in order to prevent entry of much silicon or carbon, which is a Group 14 element, to the oxide semiconductor layer 404b. That is, the concentration of silicon and carbon contained in the oxide semiconductor layer 404b is preferably lower than that in the first oxide layer 404a and the second oxide layer 404c.

Note that the impurity concentration of the oxide semiconductor layer can be measured by secondary ion mass spectrometry (SIMS).

If hydrogen or moisture is contained in the oxide semiconductor layer, it can work as a donor and form an n-type region; therefore, in order to achieve a well-shaped structure, it is useful to provide a protective insulating layer (e.g. a silicon nitride layer) for preventing entry of hydrogen or moisture from the outside, above the oxide stack 404.

Figure 8:
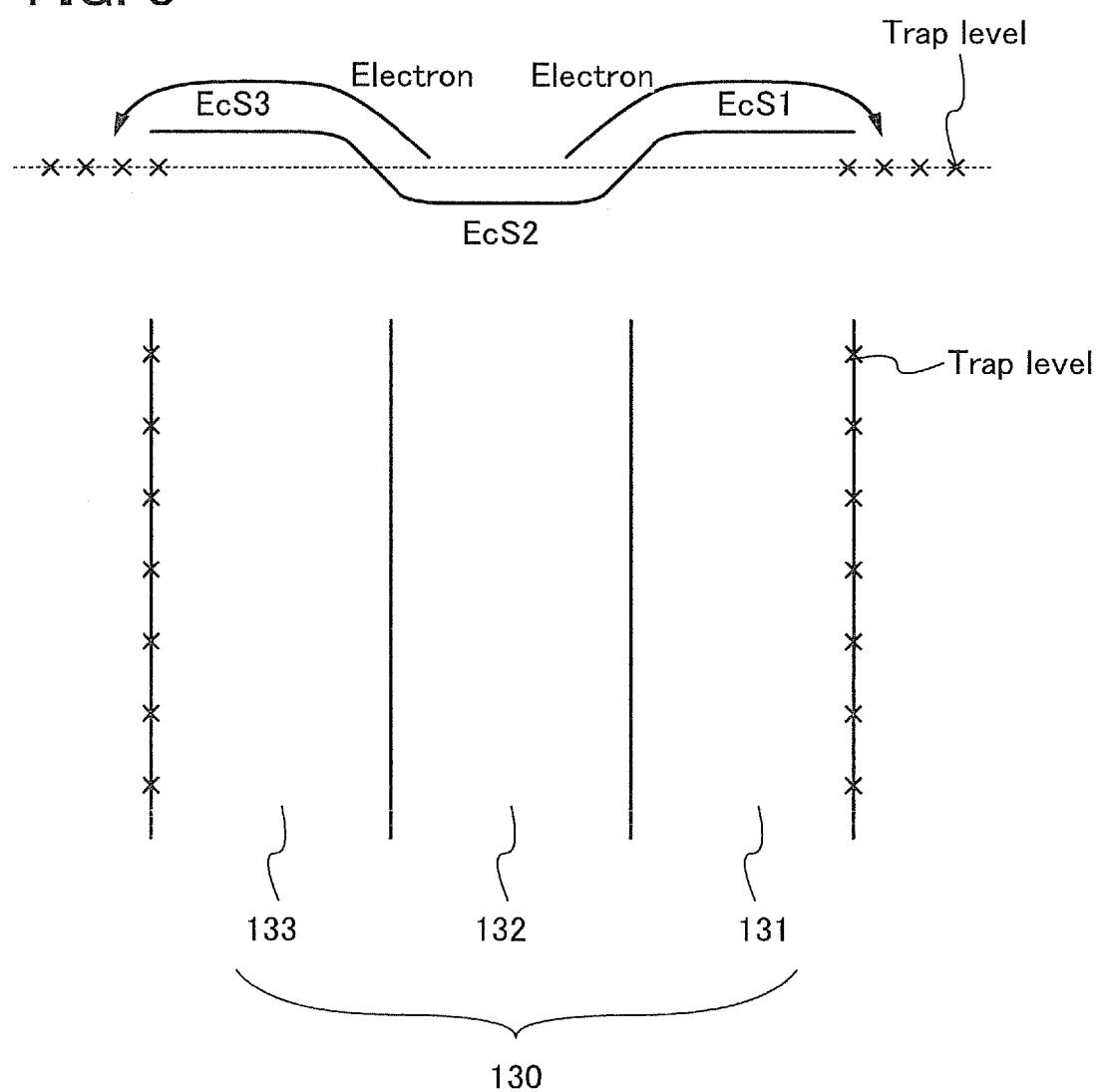
FIG. 8 illustrates a band structure of an oxide stack.

Note that although trap levels due to impurities or defects might be formed in the vicinity of the interface between an insulating film such as a silicon oxide film and each of the first oxide layer and the second oxide layer as shown in FIG. 8, the oxide semiconductor layer can be distanced away from the trap levels owing to existence of the first oxide layer and the second oxide layer. However, when the energy difference between EcS1 and EcS2 and the energy difference between EcS2 and EcS3 is small, an electron in the oxide semiconductor layer might reach the trap level by passing over the energy difference. By being trapped in the trap level, a negative fixed charge is caused at the interface with the insulating film or in the vicinity thereof, whereby the threshold voltage of the transistor is shifted in the positive direction.

Thus, the energy difference between EcS1 and EcS2 and the energy difference between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

⟨Film Formation of Oxide Stack⟩

Each of the oxide layers included in the multi-layer structure is formed using a sputtering target which contains at least indium (In) and with which a film can be formed by a sputtering method, preferably a DC sputtering method. When the sputtering target contains indium, the conductivity thereof is increased; therefore, film formation by a DC sputtering method is facilitated.

As a material forming the first oxide layer 404a and the second oxide layer 404c, a material which is represented by an In-M-Zn oxide (M is a metal element such as Al, Ti, Ga, Ge, Y, Zr, Sn, La, Ce, or Hf) is used. As M, Ga is preferably used. However, a material with a high proportion of Ga, specifically the material represented as $InGa_XZn_YO_Z$ with X exceeding 10, is not suitable because powder may be generated in the deposition and deposition by a sputtering method may become difficult.

Note that for each of the first oxide layer 404a and the second oxide layer 404c, a material in which the proportion of indium in the atomic ratio is smaller than a material used for the oxide semiconductor layer 404b is used. The indium and gallium contents in those oxide layers 404a and 404c and the oxide semiconductor layer 404b can be compared with each other by time-of-flight secondary ion mass spectrometry (also referred to as TOF-SIMS) or X-ray photoelectron spectrometry (also referred to as XPS).

When the first oxide layer 404a contains a constituent element (e.g. silicon) of the base insulating layer 402 as an impurity, it might have an amorphous structure. Note that the oxide semiconductor layer 404b in which a channel is formed preferably has a crystal part. In the case where the oxide semiconductor layer 404b having a crystal part is stacked over the first oxide layer 404a having an amorphous structure, the oxide stack can be referred to as a hetero structure having different crystal structures.

In addition, the second oxide layer 404c may have an amorphous structure or include a crystal part. Formation of the second oxide layer 404c over the oxide semiconductor layer 404b having a crystal part allows the second oxide layer 404c to have a crystal structure. In this case, a boundary between the oxide semiconductor layer 404b and the second oxide layer 404c cannot be clearly identified by observation of the cross section with a transmission electron microscope (TEM) in some cases. Note that the second oxide layer 404c has lower crystallinity than the oxide semiconductor layer 404b. Hence, it can be said that the boundary can be determined by the degree of crystallinity.

At least the oxide semiconductor layer 404b in the oxide stack 404 is preferably a c-axis aligned crystalline oxide semiconductor (CAAC-OS) film. In this specification and the like, a CAAC-OS film refers to an oxide semiconductor layer which includes a crystal part whose c-axis is aligned in a direction substantially perpendicular to the surface of the oxide semiconductor film.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a CAAC-OS film, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electrical characteristics of the transistor due to irradiation with visible light or ultraviolet light is small. Thus, the transistor has high reliability.

Note that an oxide semiconductor layer may be a stacked film including two or more films of an amorphous oxide semiconductor layer, a microcrystalline oxide semiconductor layer, and a CAAC-OS film, for example.

Note that the first oxide layer 404a and the second oxide layer 404c which are included in the oxide stack 404 might have the same structure as the above oxide semiconductor layer.

Note that it is preferable that, in the oxide stack 404, the first oxide layer 404a have an amorphous structure and that a CAAC-OS film be deposited from a surface of the amorphous structure to be used as the oxide semiconductor layer 404b.

⟨Formation Method of the CAAC-OS Film⟩

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the formation of the CAAC-OS film, the following conditions are preferably used.

By increasing the substrate temperature during the deposition, migration of a sputtered particle is likely to occur after the sputtered particle reaches a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particle reaches the substrate, migration occurs on the substrate, so that a flat plane of the sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film in a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film in a shorter time.

As an example of the sputtering target, an In—Ga—Zn—O compound target is described below.

The polycrystalline In—Ga—Zn—O compound target is made by mixing $InO_X$ powder, $GaO_Y$ powder, and $ZnO_Z$ powder at a predetermined molar ratio, applying pressure, and performing heat treatment at a temperature higher than or equal to 1000° C. and lower than or equal to 1500° C. Note that x, y, and z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that the first oxide semiconductor film serves as a first CAAC-OS film with high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness of greater than or equal to 1 nm and less than 10 nm can be easily crystallized by heat treatment compared to the case where the first oxide semiconductor film has a thickness of greater than or equal to 10 nm.

Next, a second oxide semiconductor film that has the same composition as the first oxide semiconductor film is formed to a thickness of greater than or equal to 10 nm and less than or equal to 50 nm. The second oxide semiconductor film is formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that solid phase growth of the second oxide semiconductor film from the first CAAC-OS film occurs, whereby the second oxide semiconductor film is turned into a second CAAC-OS film having high crystallinity. The temperature of the heat treatment is higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor film in a shorter time.

As described above, the CAAC-OS film with a total thickness of 10 nm or more can be formed. The CAAC-OS film can be favorably used as the oxide semiconductor layer in the oxide stack.

The methods and structures described in this embodiment can be combined as appropriate with any of the methods and structures described in the other embodiments.

Embodiment 2

In this embodiment, one embodiment of a semiconductor device including the stacked structure described in Embodiment 1 will be described with reference to FIGS. 1A to 1D, FIGS. 2A to 2C, FIGS. 3A to 3D, FIGS. 9A to 9C, and FIG. 19. In this embodiment, a top gate transistor including an oxide semiconductor layer will be described as an example of the semiconductor device.

Structural Example 1 of Semiconductor Device

Figure 1C:
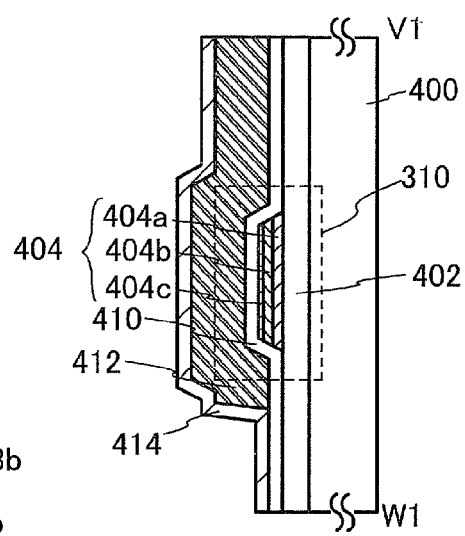
Figure 1B:
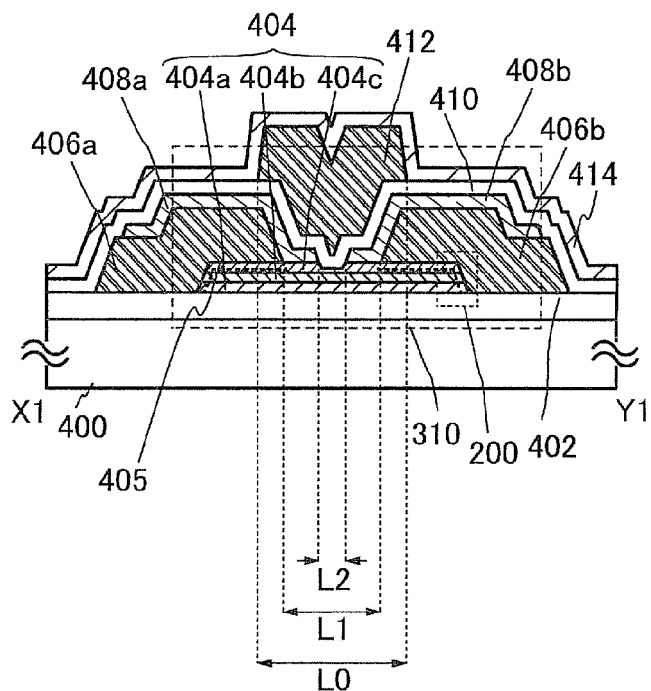
Figure 1D:
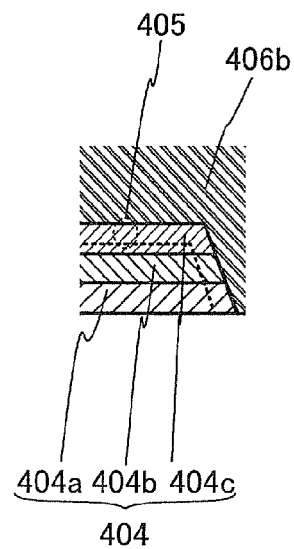

FIGS. 1A to 1D illustrate a structural example of a transistor 310. FIG. 1A is a plan view of the transistor 310, FIG. 1B is a cross-sectional view taken along dashed-dotted X1-Y1 in FIG. 1A, and FIG. 1C is a cross-sectional view taken along dashed-dotted V1-W1 in FIG. 1A. FIG. 1D is a partial enlarged view of a region 200 in FIG. 1B. Note that in FIG. 1A, some components of the transistor 310 (e.g., a protective insulating layer 414 and the like) are not illustrated to avoid complexity.

The transistor 310 illustrated in FIGS. 1A to 1D includes the base insulating layer 402 formed over a substrate 400; the island-shaped oxide stack 404 formed over the base insulating layer 402; a first source electrode layer 406a and a first drain electrode layer 406b each of which is in contact with a top surface of the island-shaped oxide stack 404 and a side face thereof in a channel length direction; a second source electrode layer 408a and a second drain electrode layer 408b which are provided over the first source electrode layer 406a and the first drain electrode layer 406b, respectively, are in contact with the top surface of the oxide stack 404, and formed using a metal nitride film; a gate insulating layer 410 which is provided over the second source electrode layer 408a and the second drain electrode layer 408b and in contact with the top surface of the oxide stack 404 between the second source electrode layer 408a and the second drain electrode layer 408b; a gate electrode layer 412 which overlaps with the oxide stack 404 with the gate insulating layer 410 provided therebetween; and the protective insulating layer 414 which is provided over and in contact with the gate insulating layer 410 and the gate electrode layer 412. Note that another insulating layer may be formed over the protective insulating layer 414.

⟨Substrate⟩

The substrate 400 is not limited to a simple supporting substrate, and may be a substrate where a device such as a transistor is formed. In this case, at least one of the gate electrode layer 412, the first source electrode layer 406a, the first drain electrode layer 406b, the second source electrode layer 408a, and the second drain electrode layer 408b which are included in the transistor 310 may be electrically connected to the above device.

⟨Base Insulating Layer⟩

The base insulating layer 402 has a function of supplying oxygen to the oxide stack 404 as well as a function of preventing diffusion of an impurity from the substrate 400; thus, an insulating layer containing oxygen is used as the base insulating layer 402. Note that in the case where the substrate 400 is a substrate where another device is formed as described above, the base insulating layer 402 has also a function as an interlayer insulating film. In that case, the base insulating layer 402 is preferably subjected to planarization treatment such as chemical mechanical polishing (CMP) treatment so as to have a flat surface.

In the transistor 310 in this embodiment, the base insulating layer 402 containing oxygen is provided below the stack structure (the oxide stack 404) including the oxide semiconductor layer. With such a structure, oxygen in the base insulating layer 402 can be supplied to a channel formation region. The base insulating layer 402 preferably has a region containing oxygen in excess of the stoichiometric composition. When the base insulating layer 402 contains oxygen in excess of the stoichiometric composition, supply of oxygen to the channel formation region can be promoted.

Note that in this specification and the like, excess oxygen means oxygen which can be transferred in an oxide semiconductor layer, silicon oxide, or silicon oxynitride, oxygen which exists in excess of the intrinsic stoichiometric composition, or oxygen having a function of filling Vo (oxygen vacancies) generated due to lack of oxygen.

⟨Gate Insulating Layer⟩

Oxygen is also supplied to the oxide stack 404 from the gate insulating layer 410 provided over and in contact with the oxide stack 404. The gate insulating layer 410 is in contact with the base insulating layer 402 outside the island-shaped oxide stack 404. Accordingly, oxygen in the base insulating layer 402 can be supplied to the oxide stack 404 from the region where the gate insulating layer 410 and the base insulating layer 402 are in contact with each other, with use of the gate insulating layer 410 as a path.

The gate insulating layer 410 is a layer which serves as a path for supplying oxygen in the base insulating layer 402 to the oxide stack 404. The gate insulating layer 410 can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Further, the gate insulating layer 410 may be a stacked layer of any of the above materials.

Since oxygen is supplied from an upper side and a bottom side of the oxide stack 404, oxygen vacancies which might be included in the oxide stack 404 can be reduced.

⟨Protective Insulating Layer⟩

As the protective insulating layer 414 provided over the gate insulating layer 410 and the gate electrode layer 412 in the transistor 310, an insulating layer having a lower oxygen-transmitting property (higher oxygen barrier property) than the gate insulating layer 410 is provided. When the protective insulating layer 414 which is provided over and in contact with the gate insulating layer 410 and the gate electrode layer 412 and has a barrier property against oxygen is provided, desorption of oxygen from the gate insulating layer 410 can be suppressed. Since the gate insulating layer 410 is an insulating layer serving as a path for supplying oxygen to the channel formation region, when desorption of oxygen from the gate insulating layer 410 is suppressed, extraction of oxygen from the oxide stack 404 which is caused by oxygen vacancies in the gate insulating layer 410 can be suppressed, so that oxygen vacancies in the channel formation region can be suppressed. As such a protective insulating layer, a silicon nitride film or a silicon nitride oxide film can be provided, for example.

Further, in an oxide semiconductor, hydrogen behaves as a supply source of carriers in addition to oxygen vacancies. When the oxide semiconductor contains hydrogen, a donor is generated at a level close to the conduction band (a shallow level), and thus the oxide semiconductor has lower resistance (n-type conductivity). Accordingly, the concentration of hydrogen in the protective insulating layer 414 is preferably reduced. Specifically, the concentration of hydrogen in the protective insulating layer 414 is preferably lower than $5\times10^{19}$ cm$^{-3}$, further preferably lower than $5\times10^{18}$ cm$^{-3}$.

⟨Oxide Stack⟩

The oxide stack 404 includes the oxide semiconductor layer 404b in which at least a channel is formed, the first oxide layer 404a which is provided between the oxide semiconductor layer 404b and the base insulating layer 402, and the second oxide layer 404c which is provided between the oxide semiconductor layer 404b and the gate insulating layer 410.

Each of the first oxide layer 404a and the second oxide layer 404c is an oxide layer containing one or more kinds of metal elements forming the oxide semiconductor layer 404b. For the details of the oxide stack 404, refer to Embodiment 1.

In the oxide stack 404, the oxide layers in which oxygen vacancies are less likely to be generated than in the oxide semiconductor layer 404b are provided over and under and in contact with the oxide semiconductor layer 404b where a channel is formed, whereby generation of oxygen vacancies in the channel of the transistor can be suppressed.

Note that in order to make the oxide semiconductor layer intrinsic or substantially intrinsic, the concentration of silicon in the oxide semiconductor layer, which is measured by SIMS, is set to be lower than $1\times10^{19}$ atoms/cm$^3$, preferably lower than $5\times10^{18}$ atoms/cm$^3$, further preferably lower than $3\times10^{18}$ atoms/cm$^3$, still further preferably lower than $1\times10^{18}$ atoms/cm$^3$. The concentration of hydrogen in the oxide semiconductor layer is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor layer is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. The crystallinity of the oxide semiconductor layer can be prevented from decreasing when the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$, and the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor film is used for a channel formation region as described above has extremely low off-state current. For example, the drain current at the time when the transistor including a highly purified oxide semiconductor film is in an off-state at room temperature (approximately 25° C.) can be less than or equal to $1\times10^{-18}$ A, preferably less than or equal to $1\times10^{-21}$ A, and further preferably $1\times10^{-24}$ A; or at 85° C., less than or equal to $1\times10^{-15}$ A, preferably less than or equal to $1\times10^{-18}$ A, further preferably less than or equal to $1\times10^{-21}$ A. An off state of a transistor refers to a state where a gate voltage is much lower than a threshold voltage in an n-channel transistor. Specifically, the transistor is in an off state when the gate voltage is lower than the threshold voltage by 1 V or more, 2 V or more, or 3 V or more.

⟨Source Electrode Layer and Drain Electrode Layer⟩

The transistor 310 includes the first source electrode layer 406a and the first drain electrode layer 406b each of which is in contact with the side face of the oxide stack 404 in the channel length direction, and the second source electrode layer 408a and the second drain electrode layer 408b which are provided over the first source electrode layer 406a and the first drain electrode layer 406b and have regions extending beyond the first source electrode layer 406a and the first drain electrode layer 406b in the channel length direction.

For the first source electrode layer 406a and the first drain electrode layer 406b, a conductive material which is easily bonded to oxygen can be used. For example, Al, Cr, Cu, Ta, Ti, Mo, or W can be used. In particular, W with a high melting point is preferably used, which allows subsequent process temperatures to be relatively high. Note that the conductive material which is easily bonded to oxygen includes, in its category, a material to which oxygen is easily diffused.

When such a conductive material which is easily bonded to oxygen is in contact with the oxide stack 404, oxygen in the oxide stack 404 is taken into the conductive material. There are some heating steps in a fabrication process of the transistor, and thus oxygen vacancies are generated in a region of the oxide stack 404 which is in the vicinity of an interface between the oxide stack 404 and each of the first source electrode layer 406a and the first drain electrode layer 406b, so that an n-type region 405 is formed (see FIG. 1D). Accordingly, the n-type region 405 can serve as a source or a drain of the transistor 310.

Note that a constituent element of the first source electrode layer 406a and the first drain electrode layer 406b may enter the region 405. Further, parts of the first source electrode layer 406a and the first drain electrode layer 406b, which are in contact with the regions 405, might have a region having high oxygen concentration. A constituent element of the oxide stack 404 may enter the parts of the first source electrode layer 406a and the first drain electrode layer 406b, which are in contact with the regions 405. That is, in the vicinity of the interface between the oxide stack 404 and each of the first source electrode layer 406a and the first drain electrode layer 406b, a portion which can be called a mixed region or a mixed layer of the oxide stack 404 and each of the first source electrode layer 406a and the first drain electrode layer 406b is formed in some cases. Note that an interface between the n-type region 405 and a region which is not made to have n-type conductivity is schematically indicated by a dotted line. The same applies to other drawings referred to below.

Further, in the case of forming a transistor with an extremely short channel length, the n-type region which is formed by the generation of the oxygen vacancies sometimes extends in the channel of the transistor. In that case, electrical characteristics of the transistor change; for example, the threshold voltage is shifted or on and off of the transistor cannot be controlled with the gate voltage (i.e., the transistor is on). Accordingly, when a transistor with an extremely short channel length is formed, it is preferable that the conductive material which is not easily bonded to oxygen be used for the source electrode and the drain electrode.

Therefore, the second source electrode layer 408a and the second drain electrode layer 408b which have regions extending beyond the first source electrode layer 406a and the first drain electrode layer 406b in the channel length direction and determine a channel length are stacked over the first source electrode layer 406a and the first drain electrode layer 406b, and formed using a conductive material which is not easily bonded to oxygen, As the conductive material, for example, tantalum nitride, titanium nitride, or the like is preferably used. Note that the conductive material which is not easily bonded to oxygen includes, in its category, a material to which oxygen is not easily diffused.

Note that in the transistor having the structure illustrated in FIGS. 1A to 1D, the channel length refers to a distance L2 between the second source electrode layer 408a and the second drain electrode layer 408b.

Further, in the transistor having the structure illustrated in FIGS. 1A to 1D, a channel means a part of the oxide semiconductor layer 404b which is between the second source electrode layer 408a and the second drain electrode layer 408b.

Furthermore, in the transistor having the structure illustrated in FIGS. 1A to 1D, a channel formation region means parts of the first oxide layer 404a, the oxide semiconductor layer 404b, and the second oxide layer 404c which are between the second source electrode layer 408a and the second drain electrode layer 408b.

By the use of the above conductive material which is not easily bonded to oxygen for the second source electrode layer 408a and the second drain electrode layer 408b, generation of oxygen vacancies in the channel formation region, which is formed in the oxide stack 404, can be suppressed, so that change of the channel into an n-type can be suppressed. In this manner, even a transistor with an extremely short channel length can have favorable electrical characteristics.

In the case where the source electrode layer and the drain electrode layer are formed using only the above conductive material which is not easily bonded to oxygen, the contact resistance with the oxide stack 404 becomes too high; thus, it is preferable that as illustrated in FIG. 1B, the first source electrode layer 406a and the first drain electrode layer 406b be formed over the oxide stack 404 and the second source electrode layer 408a and the second drain electrode layer 408b be formed over and in contact with the first source electrode layer 406a and the first drain electrode layer 406b.

At this time, it is preferable that the oxide stack 404 have a large contact area with the first source electrode layer 406a or the first drain electrode layer 406b, and the oxide stack 404 have a small contact area with the second source electrode layer 408a or the second drain electrode layer 408b. The contact resistance between the oxide stack 404 and each of the first source electrode layer 406a and the first drain electrode layer 406b is reduced by the n-type region 405 due to generation of oxygen vacancies. On the other hand, the contact resistance between the oxide stack 404 and each of the second source electrode layer 408a and the second drain electrode layer 408b is higher than the contact resistance between the oxide stack 404 and each of the first source electrode layer 406a and the first drain electrode layer 406b. Therefore, when the contact area of the oxide stack 404 with each of the second source electrode layer 408a and the second drain electrode layer 408b is large, electrical characteristics of the transistor are degraded in some cases.

Even when the distance (L2) between the second source electrode layer 408a and the second drain electrode layer 408b is shorter than a distance L1 between the first source electrode layer 406a and the first drain electrode layer 406b, for example, 30 nm or shorter, the transistor can have favorable electrical characteristics.

⟨Gate Electrode Layer⟩

For the gate electrode layer 412, a conductive film formed using Al, Ti, Cr, Co, Ni, Cu, Y, Zr, Mo, Ru, Ag, Ta, W, or the like can be used.

The structure of the transistor of one embodiment of the present invention can suppress an increase in oxygen vacancies in the oxide semiconductor layer. Accordingly, a semiconductor device which has favorable electrical characteristics and high long-term reliability can be provided.

Structural Example 2 of Semiconductor Device

Figure 2A:
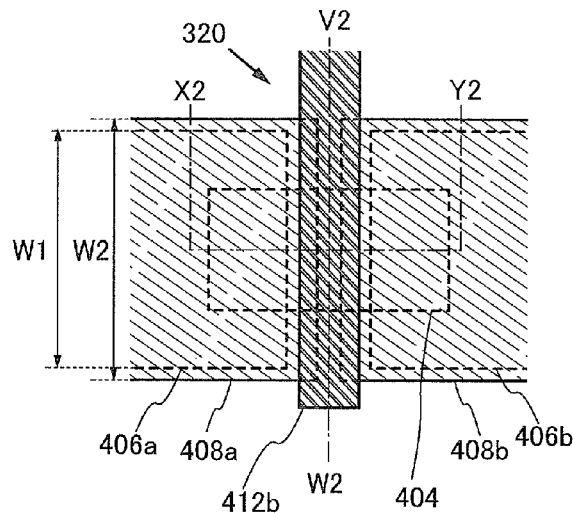
FIGS. 2A to 2C are a plan view and cross-sectional views illustrating one embodiment of a semiconductor device.
Figure 2C:
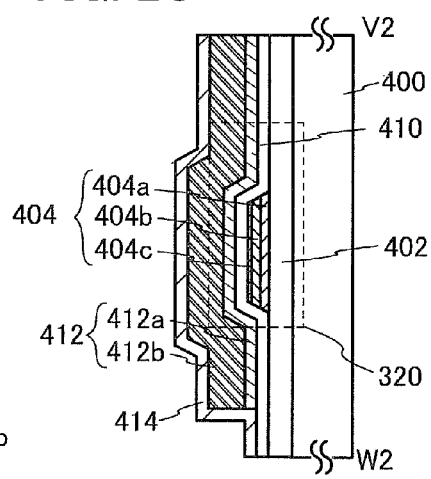
Figure 2B:
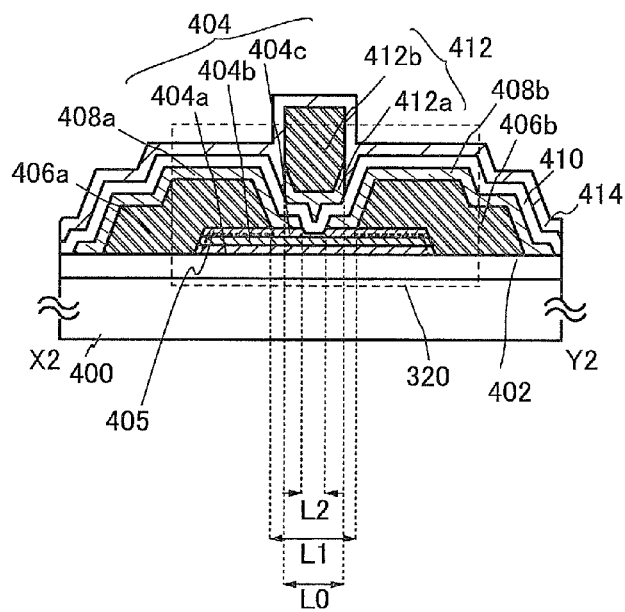

FIGS. 2A to 2C illustrate a structural example of a transistor 320. FIG. 2A is a plan view of the transistor 320, FIG. 2B is a cross-sectional view taken along dashed-dotted line X2-Y2 in FIG. 2A, and FIG. 2C is a cross-sectional view taken along dashed-dotted line V2-W2 in FIG. 2A. Note that in FIG. 2A, some components of the transistor 320 (e.g., the protective insulating layer 414 and the like) are not illustrated to avoid complexity.

The transistor 320 illustrated in FIGS. 2A to 2C includes the base insulating layer 402 formed over the substrate 400; the island-shaped oxide stack 404 formed over the base insulating layer; the first source electrode layer 406a and the first drain electrode layer 406b each of which is in contact with a top surface of the island-shaped oxide stack and a side face thereof in a channel length direction; the second source electrode layer 408a and the second drain electrode layer 408b which are provided so as to cover the first source electrode layer 406a and the first drain electrode layer 406b, respectively, are in contact with the top surface of the oxide stack 404, and formed using a metal nitride film; the gate insulating layer 410 which is provided over the second source electrode layer 408a and the second drain electrode layer 408b and in contact with the top surface of the oxide stack 404 between the second source electrode layer 408a and the second drain electrode layer 408b; the gate electrode layer 412 which overlaps with the oxide stack 404 with the gate insulating layer 410 provided therebetween; and the protective insulating layer 414 which is provided over and in contact with the gate insulating layer 410 and the gate electrode layer 412. Note that another insulating layer may be formed over the protective insulating layer 414.

One of the differences between the transistor 310 and the transistor 320 is the length L0 of the gate electrode layer 412 in a channel length direction. In the transistor 320, a structure in which the first source electrode layer 406a and the first drain electrode layer 406b do not overlap with the gate electrode layer 412 is employed in order to reduce parasitic capacitance between the gate and the drain and parasitic capacitance between the gate and the source. When the width of the gate electrode layer 412 is L0 and L1≥L0≥L2 (L0 is greater than or equal to L2 and less than or equal to L1), the parasitic capacitance between the gate and the drain and the parasitic capacitance between the gate and the source can be reduced as much as possible, so that the frequency characteristics of the transistor can be improved. Note that in order to obtain favorable electrical characteristics of the transistor, (L1−L2)/2 is preferably less than 20% of L2.

The area occupied by the transistor 320 is preferably 1 μm$^2$ to 25 μm$^2$. For example, when the length of the oxide stack 404 in the channel length direction in the transistor 320 illustrated in FIGS. 2A to 2C is 300 nm, it is preferable that L0 be 40 nm and L2 be 30 nm. In this case, the area of a top surface of the island-shaped oxide stack 404 can be less than or equal to 1 μm$^2$.

Note that in a transistor that does not require high frequency characteristics, L0≥L1≥L2 (L1 is longer than or equal to L2 and shorter than or equal to L0) may be satisfied as illustrated in FIG. 1B. With such a structure, the degree of difficulty in formation steps of the gate electrode can be lowered.

Another difference between the transistor 310 and the transistor 320 is a structure of the gate electrode layer 412. In the transistor 320, the gate electrode layer 412 has a stacked-layer structure of a first gate electrode layer 412a in contact with the gate insulating layer 410 and a second gate electrode layer 412b. Here, when the first gate electrode layer 412a is formed using a material similar to that of the second source electrode layer 408a and the second drain electrode layer 408b, extraction of oxygen from the gate insulating layer 410 by the gate electrode layer 412 can be prevented.

Another difference between the transistor 310 and the transistor 320 is a structure of the second source electrode layer 408a and the second drain electrode layer 408b. When the width of the first source electrode layer 406a (or the first drain electrode layer 406b) in a channel width direction is W1 and the width of the second source electrode layer 408a (or the second drain electrode layer 408b) in a channel width direction is W2, W1<W2 (W2 is larger than W1) in the transistor 320, and thus the transistor 320 has a structure in which the second source electrode layer 408a (or the second drain electrode layer 408b) covers the first source electrode layer 406a (or the first drain electrode layer 406b).

Such a structure can prevent the gate insulating layer 410 from being in contact with the first source electrode layer 406a and the first drain electrode layer 406b formed using a conductive material which is easily bonded to oxygen. Accordingly, oxygen can be prevented from being extracted from the gate insulating layer 410.

Since the gate insulating layer 410 is a layer which serves as a path for supplying oxygen to the oxide stack 404, extraction of oxygen from the gate insulating layer 410 by the first source electrode layer 406a and the first drain electrode layer 406b is prevented, whereby oxygen can be supplied to the oxide stack 404 effectively. Accordingly, oxygen vacancies can be prevented from being generated in the oxide stack 404, and thus reliability of the transistor 320 can be improved.

Note that the other components of the transistor 320 have the same structure as the transistor 310; therefore, the description of the transistor 310 can be referred to.

Structural Example 3 of Semiconductor Device

Figure 3A:
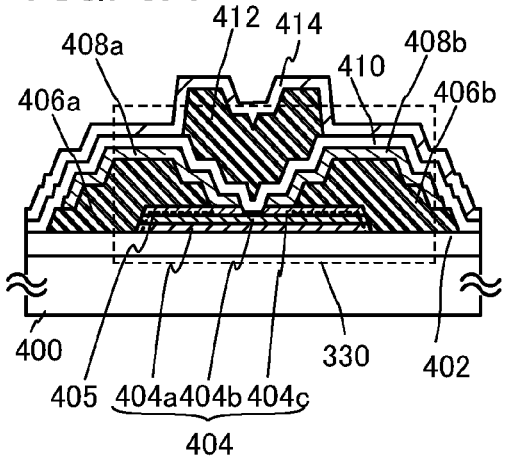
FIGS. 3A to 3D are cross-sectional views illustrating one embodiment of a semiconductor device.
Figure 3B:
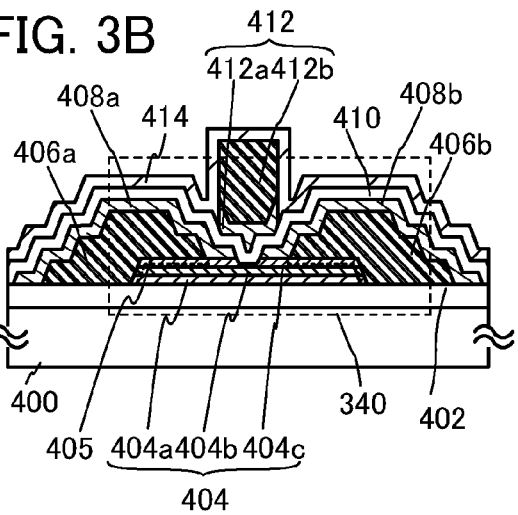

FIGS. 3A and 3B illustrate modification examples of the transistor 310 and the transistor 320. End portions of the first source electrode layer 406a and the first drain electrode layer 406b in a transistor 330 illustrated in FIG. 3A are different from those of the first source electrode layer 406a and the first drain electrode layer 406b in the transistor 310. End portions of the first source electrode layer 406a and the first drain electrode layer 406b in a transistor 340 illustrated in FIG. 3B are different from those of the first source electrode layer 406a and the first drain electrode layer 406b in the transistor 320. Note that the structures of the transistors 330 and 340 except those of the end portions of the first source electrode layer 406a and the first drain electrode layer 406b are similar to the structures of the transistors 310 and 320, respectively; therefore, the above description can be referred to.

Figure 3C:
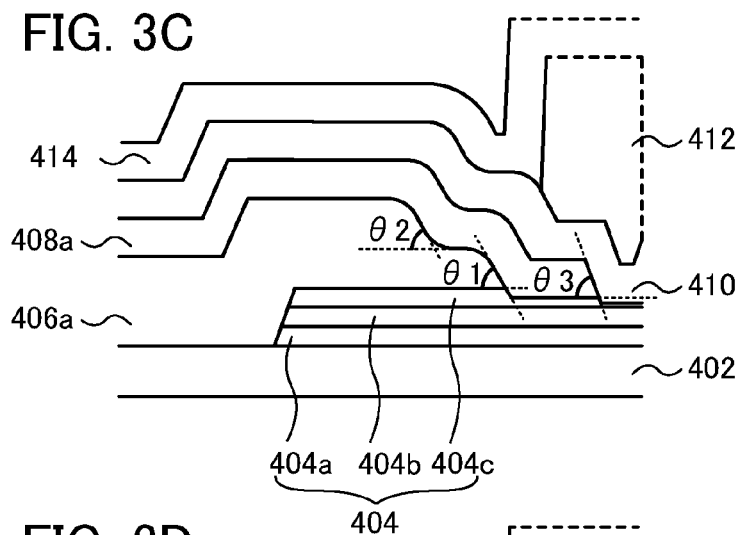
Figure 3D:
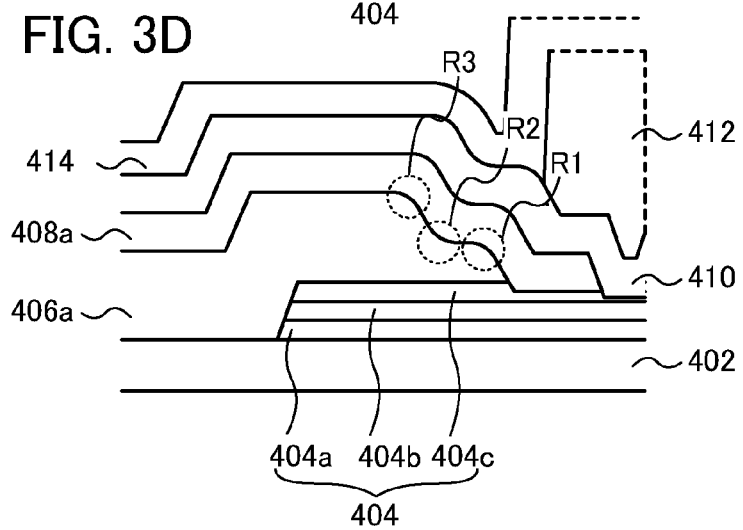

FIGS. 3C and 3D are enlarged views each illustrating the first source electrode layer 406a in the transistors 330 and 340. It is preferable that in each of the transistors 330 and 340, the end portions of the first source electrode layer 406a and the first drain electrode layer 406b have a staircase-like shape including a plurality of steps, an end surface of a lower step be formed at an angle θ1 using the top surface of the oxide stack 404 as a reference, and an end surface of an upper step be formed at an angle θ2 using a top surface of the lower step as a reference. Further, it is preferable that the first source electrode layer 406a and the first drain electrode layer 406b be formed so as to have a curved surface having a curvature radius R1 between the top surface and the end surface of the lower step, a curved surface having a curvature radius R3 between a top surface and the end surface of the upper step, and a curved surface having a curvature radius R2 between the top surface of the lower step and the end surface of the upper step.

Note that in FIGS. 3A to 3D, two steps are provided in each of the end portions of the first source electrode layer 406a and the first drain electrode layer 406b; however, the number of steps may be three or more. It is preferable that the number of steps be increased as the thickness of each of the first source electrode layer 406a and the first drain electrode layer 406b is larger. Note that the end portions of the first source electrode layer 406a and the first drain electrode layer 406b is not necessarily symmetric to each other. In the case where the thickness of each of the first source electrode layer 406a and the first drain electrode layer 406b can be made small, the number of steps may be one, that is, each of the first source electrode layer 406a and the first drain electrode layer 406b may have a shape having only the angle θ1 and the curvature radius R1.

Here, the angles θ1 and θ2 are greater than or equal to 20° and less than or equal to 80°, preferably greater than or equal to 25° and less than or equal to 70°, further preferably greater than or equal to 30° and less than or equal to 60°. When the thickness of a region of the first source electrode layer 406a or the first drain electrode layer 406b in which a step is not formed is used as a reference, the curvature radii R1, R2, and R3 are greater than or equal to 10% and less than or equal to 100% of the thickness, preferably greater than or equal to 20% and less than or equal to 75% of the thickness, further preferably greater than or equal to 30% and less than or equal to 60% of the thickness. The curvature radius R2 is preferably larger than either or both of the curvature radii R1 and R3.

When each of the first source electrode layer 406a and the first drain electrode layer 406b has a shape including a plurality of steps as described above, coverage with the films formed over the first source electrode layer 406a and the first drain electrode layer 406b, specifically, coverage with the second source electrode layer 408a, the second drain electrode layer 408b, the gate insulating layer 410, and the like is improved, so that the transistor can have more favorable electrical characteristics and higher long-term reliability.

Further, an end surface of the second source electrode layer 408a or the second drain electrode layer 408b is formed at an angle θ3 using the top surface of the oxide stack 404 as a reference. The angle θ3 is greater than or equal to 30° and less than or equal to 80°, preferably greater than or equal to 35° and less than or equal to 75°. With such an angle, coverage with the gate insulating layer 410 and the like is improved, so that the transistor can have more favorable electrical characteristics and higher long-term reliability.

Structural Example 4 of Semiconductor Device

FIGS. 9A to 9C illustrates a structural example of a transistor 350. The transistor 350 is a modification example of the transistor 320 in FIGS. 2A to 2C. FIG. 9A is a plan view of the transistor 350, FIG. 9B is a cross-sectional view taken along line X3-Y3 in FIG. 9A, and FIG. 9C is a cross-sectional view taken along line V3-W3 in FIG. 9A. Note that in FIG. 9A, some components of the transistor 350 (e.g., the protective insulating layer 414 and the like) are not illustrated to avoid complexity.

A difference between the transistor 320 and the transistor 350 is a stacking order of the oxide stack 404 and the source electrode layer and the drain electrode layer. That is, in the transistor 350, the first source electrode layer 406a and the first drain electrode layer 406b are provided so as to cover side faces of an island-shaped first oxide layer 407a in a channel length direction, and side faces in the channel length direction and part of a top surface of an island-shaped oxide semiconductor layer 407b, and an island-shaped second oxide layer 407c is provided over and in contact with the first source electrode layer 406a and the first drain electrode layer 406b. Further, the second source electrode layer 408a and the second drain electrode layer 408b are provided over the second oxide layer 407c.

In a region of the first oxide layer 407a, the oxide semiconductor layer 407b, and the second oxide layer 407c, which is in contact with the first source electrode layer 406a or the first drain electrode layer 406b, the n-type region 405 is formed due to extraction of oxygen by the first source electrode layer 406a or the first drain electrode layer 406b. In the transistor 350, an oxide stack 407 including the first oxide layer 407a, the oxide semiconductor layer 407b, and the second oxide layer 407c is formed between the base insulating layer 402 and the gate insulating layer 410.

A region of the oxide semiconductor layer 407b included in the oxide stack 407, which does not overlap with the first source electrode layer 406a and the first drain electrode layer 406b, that is, a region which is not made to have n-type conductivity, has a small thickness in some cases, by being partly etched at the time of processing into the first source electrode layer 406a and the first drain electrode layer 406b. A region of the second oxide layer 407c which does not overlap with the second source electrode layer 408a and the second drain electrode layer 408b has a small thickness in some cases, by being partly etched at the time of processing into the second source electrode layer 408a and the second drain electrode layer 408b.

As illustrated in FIG. 9C, in a cross section taken along the channel width direction, the transistor 350 can have a structure in which side faces of the island-shaped first oxide layer 407a and the island-shaped oxide semiconductor layer 407b are covered with the second oxide layer 407c. With such a structure, the influence of a parasitic channel which may be generated in an end portion of the oxide stack 407 in the channel width direction can be reduced. Therefore, reliability of the transistor can be improved.

Figure 19:
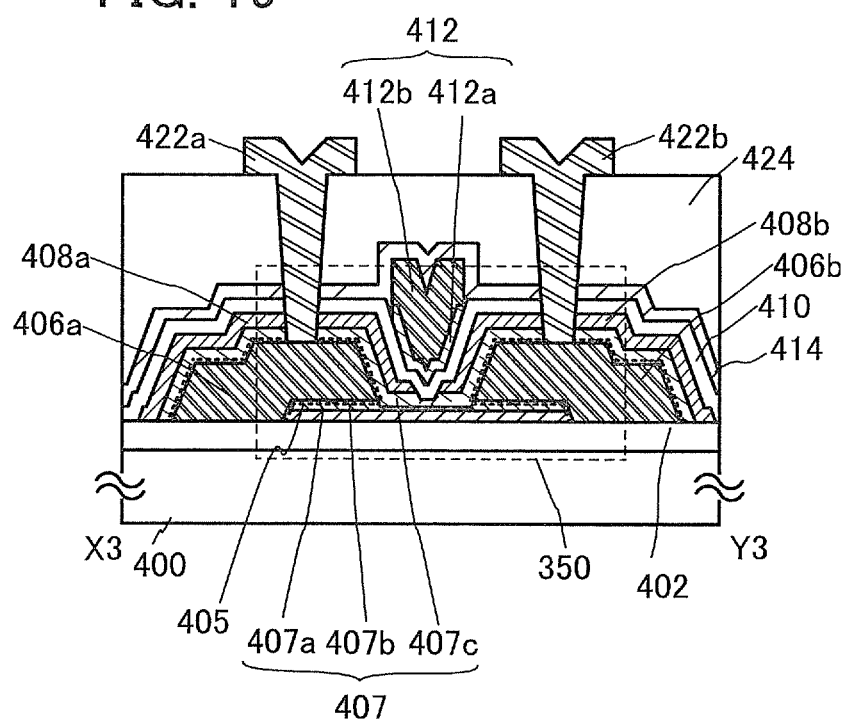
FIG. 19 is a cross-sectional view illustrating one embodiment of a semiconductor device.

As illustrated in FIG. 19, the first source electrode layer 406a and the second source electrode layer 408a are electrically connected to each other in such a manner that a contact hole reaching the first source electrode layer 406a is formed in an interlayer insulating layer 424 provided over the protective insulating layer 414, and an electrode layer 422a is formed in the contact hole. Similarly, the first drain electrode layer 406b and the second drain electrode layer 408b are electrically connected to each other in such a manner that a contact hole reaching the first drain electrode layer 406b is formed in the interlayer insulating layer 424, and an electrode layer 422b is formed in the contact hole.

The size of each of the first source electrode layer 406a and the first drain electrode layer 406b (the area of a top surface thereof) is made to be larger than the size of the contact hole provided in the interlayer insulating layer 424 (the area of a plane surface of the contact hole). For miniaturization of the transistor, the size of the electrode layer is preferably reduced.

As the interlayer insulating layer 424, an organic insulating layer or an inorganic insulating layer can be used as appropriate. In particular, an organic resin film which can be readily formed to have high planarity is preferably used. For the electrode layer 422a and the electrode layer 422b, a material similar to that of the first source electrode layer 406a and the first drain electrode layer 406b is preferably used.

The above is the description of the transistor of one embodiment of the present invention. In the transistor described in this embodiment, oxygen can continue to be supplied to the channel formation region from the base insulating layer or through the gate insulating layer which is in contact with the base insulating layer outside the island-shaped oxide stack. The structure of the transistor can suppress an increase in oxygen vacancies in the oxide semiconductor layer and reduce the impurity concentration, so that the oxide semiconductor layer can be highly purified to be a highly purified intrinsic oxide semiconductor layer.

Accordingly, variation in electrical characteristics, such as change in threshold voltage, which might occur due to oxygen vacancies in the channel formation region, can be suppressed. Specifically, for example, the transistor including the oxide stack 404 has normally-off characteristics with a positive threshold voltage. Accordingly, a semiconductor device having favorable electrical characteristics and high long-term reliability can be provided.

Note that the structures of the transistors described in this embodiment can be freely combined with each other. For example, the transistor 310 may have the gate electrode layer of the transistor 320, which has the stacked-layer structure.

Note that this embodiment can be combined as appropriate with any of the other embodiments and examples in this specification.

Embodiment 3

In this embodiment, an example of a method for fabricating the transistor described in Embodiment 1 will be described. In this embodiment, a case of fabricating the transistor 340 illustrated in FIG. 3B will be described as an example with reference to FIGS. 4A to 4C and FIGS. 5A to 5D.

Figure 4A:
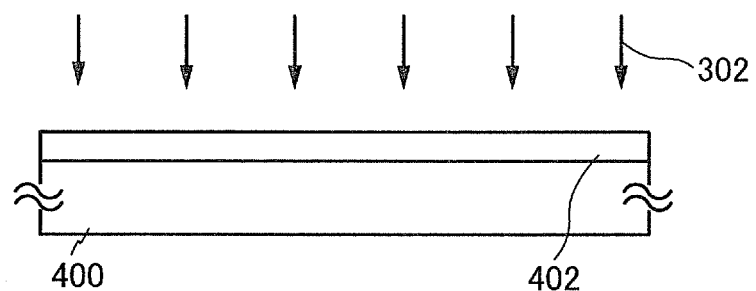
FIGS. 4A to 4C are cross-sectional views illustrating an example of a method for fabricating a semiconductor device.

First, the base insulating layer 402 is formed over the substrate 400 having an insulating surface (see FIG. 4A).

The base insulating layer 402 is formed to a thickness greater than or equal to 1 nm and less than or equal to 100 nm, and an insulating film containing oxygen, such as an aluminum oxide film, a magnesium oxide film, a silicon oxide film, a silicon oxynitride film, a gallium oxide film, a germanium oxide film, an yttrium oxide film, a zirconium oxide film, a lanthanum oxide film, a neodymium oxide film, a hafnium oxide film, or a tantalum oxide film, which is formed by a plasma CVD method or a sputtering method can be used for the base insulating layer 402.

At least an upper layer of the base insulating layer 402, which is in contact with the oxide stack 404 and the gate insulating layer 410 which are to be formed later, is formed using a material containing oxygen so as to supply oxygen to the oxide stack 404. Further, the base insulating layer 402 is preferably a film containing excess oxygen.

In order to make the base insulating layer 402 contain excess oxygen, the base insulating layer 402 may be formed in an oxygen atmosphere, for example. Alternatively, the base insulating layer 402 may contain excess oxygen in such a manner that oxygen is introduced into the base insulating layer 402 which has been formed. Both the methods may be combined.

In this embodiment, oxygen 302 (at least including any of oxygen radicals, oxygen atoms, or oxygen ions) is introduced into the base insulating layer 402 which has been formed to form an oxygen-excess region. As a method for introducing oxygen, an ion implantation method, an ion doping method, a plasma immersion ion implantation method, plasma treatment, or the like may be used.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introducing treatment.

Figure 4B:
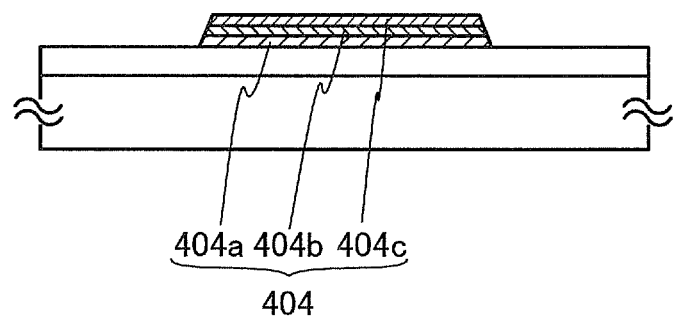

Then, the first oxide layer 404a, the oxide semiconductor layer 404b, and the second oxide layer 404c are formed over the base insulating layer 402 by a sputtering method, a CVD method, an MBE method, an ALD method, or a PLD method and selectively etched, so that the oxide stack 404 is formed (see FIG. 4B). Note that heating may be performed before etching.

For the first oxide layer 404a, the oxide semiconductor layer 404b, and the second oxide layer 404c, the material described in Embodiment 1 can be used.

For example, the first oxide layer 404a is preferably formed using an In—Ga—Zn oxide whose atomic ratio of In to Ga and Zn is 1:3:2, an In—Ga—Zn oxide whose atomic ratio of In to Ga and Zn which is 1:6:4, an In—Ga—Zn oxide whose atomic ratio of In to Ga and Zn is 1:9:6, or an oxide having a composition is in the neighborhood of any of the above atomic ratios.

Further, for example, the oxide semiconductor layer 404b is preferably formed using an In—Ga—Zn oxide having an atomic ratio of In to Ga and Zn which is 1:1:1, an In—Ga—Zn oxide having an atomic ratio of In to Ga and Zn which is 3:1:2, or an oxide having a composition which is in the neighborhood of any of the above atomic ratios.

Further, for example, the second oxide layer 404c is preferably formed using an In—Ga—Zn oxide having an atomic ratio of In to Ga and Zn which is 1:3:2 or an oxide having a composition which is in the neighborhood of the above atomic ratio.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C^2)\leq r^2$, and r may be 0.05, for example.

Note that the composition of each of the oxide layers is not limited to the above atomic ratios. The indium content in the oxide semiconductor layer 404b is preferably higher than those in the first oxide layer 404a and the second oxide layer 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Further, gallium needs large formation energy of an oxygen vacancy and thus is not likely to generate an oxygen vacancy as compared to indium. Therefore, an oxide having a high gallium content has stable characteristics.

Thus, with use of an oxide having a high indium content for the oxide semiconductor layer 404b, a transistor having high mobility can be achieved. Further, when an oxide having a high gallium content (here, the first oxide layer 404a and the second oxide layer 404c) is used, the transistor can have higher reliability.

Further, an oxide semiconductor that can be used for the first oxide layer 404a, the oxide semiconductor layer 404b, and the second oxide layer 404c preferably contains at least indium (In) or zinc (Zn). Alternatively, the oxide semiconductor preferably contains both In and Zn. Specifically, it is preferable that the oxide semiconductor layer 404b contain indium because the carrier mobility of the transistor can be increased, and the oxide semiconductor layer 404b contain zinc because a CAAC-OS film is formed easily. In order to reduce fluctuation in electrical characteristics of the transistors including the oxide semiconductor layer, the oxide semiconductor layer preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that as described in Embodiment 1 in detail, a material of the first oxide layer 404a and the second oxide layer 404c is selected so that the first oxide layer 404a and the second oxide layer 404c have higher electron affinities than that of the oxide semiconductor layer 404b.

Note that the oxide stack is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that oxygen may be introduced into the first oxide layer 404a at timing which is after formation of the first oxide layer 404a and before formation of the oxide semiconductor layer 404b. By the oxygen introduction treatment, the first oxide layer 404a contains excess oxygen, so that the excess oxygen can be supplied to the oxide semiconductor layer 404b by heat treatment in a later film formation step.

Accordingly, oxygen vacancies in the oxide semiconductor layer 404b can be suppressed more by the oxygen introduction treatment performed on the first oxide layer 404a.

Note that the first oxide layer 404a becomes amorphous by the oxygen introduction treatment in some cases. In the oxide stack 404, at least the oxide semiconductor layer 404b is preferably a CAAC-OS film. Accordingly, the oxygen introduction treatment is preferably performed at timing which is after formation of the first oxide layer 404a and before formation of the oxide semiconductor layer 404b.

After the oxide stack 404 is formed, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the oxide semiconductor layer 404b can be increased, and moreover, an impurity such as hydrogen or water can be removed from at least one of the base insulating layer 402, the first oxide layer 404a, the oxide semiconductor layer 404b, and the second oxide layer 404c. Note that the step of the first heat treatment may be performed before etching for formation of the oxide stack 404.

After that, a first conductive film to be the first source electrode layer 406a and the first drain electrode layer 406b is formed over the oxide stack 404. For the first conductive film, Al, Cr, Cu, Ta, Ti, Mo, W, or an alloy material containing any of these as a main component can be used. For example, a 100-nm-thick tungsten film is formed by a sputtering method or the like.

Figure 4C:
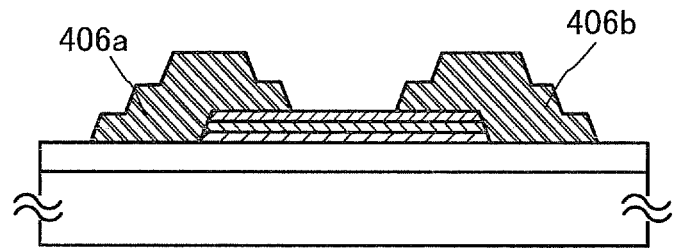

Next, the first conductive film is etched so as to be divided over the oxide stack 404, so that the first source electrode layer 406a and the first drain electrode layer 406b are formed (see FIG. 4C). At this time, the end portions of the first source electrode layer 406a and the first drain electrode layer 406b are preferably formed so as to have a staircase-like shape as illustrated in the drawing. The end portions can be formed in such a manner that a step of making a resist mask recede by ashing and an etching step are alternately performed plural times.

Note that although not illustrated, by overetching of the first conductive film 108, part of the oxide stack 404 (an exposed region) is etched in some cases.

Then, a second conductive film to be the second source electrode layer 408a and the second drain electrode layer 408b is formed over the oxide stack 404, the first source electrode layer 406a, and the first drain electrode layer 406b. As the second conductive film, a metal nitride film of tantalum nitride, titanium nitride, or the like, or an alloy material containing any of these as its main component can be used. For example, a 20-nm-thick tantalum nitride film is formed by a sputtering method or the like.

Figure 5A:
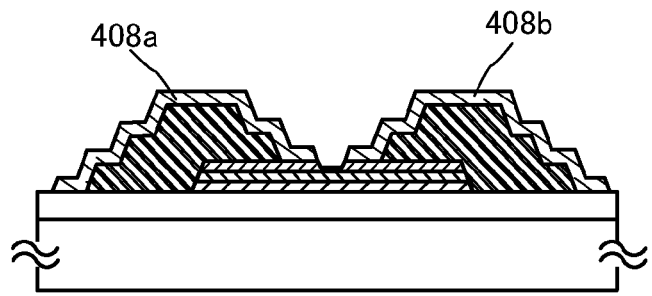
FIGS. 5A to 5D are cross-sectional views illustrating an example of the method for fabricating a semiconductor device.

Next, the second conductive film is etched so as to be divided over the oxide stack 404, so that the second source electrode layer 408a and the second drain electrode layer 408b are formed (see FIG. 5A). At this time, part of the oxide stack 404 (specifically, part of the second oxide layer 404c) may be etched. Note that although not illustrated, by the etching treatment for forming the second source electrode layer 408a and the second drain electrode layer 408b, a region of the base insulating layer 402 which is exposed from the second source electrode layer 408a and the second drain electrode layer 408b is etched and has a smaller thickness in some cases.

Note that in the case of forming a transistor whose channel length (a distance between the second source electrode layer 408a and the second drain electrode layer 408b) is extremely short, at least a region to divide the second conductive film is etched using resist masks that are processed by a method suitable for fine line processing, such as electron beam exposure. Note that by the use of a positive type resist for the resist masks, the exposed region can be minimized and throughput can be thus improved. In the above manner, a transistor having a channel length of 30 nm or less can be formed.

Figure 5B:
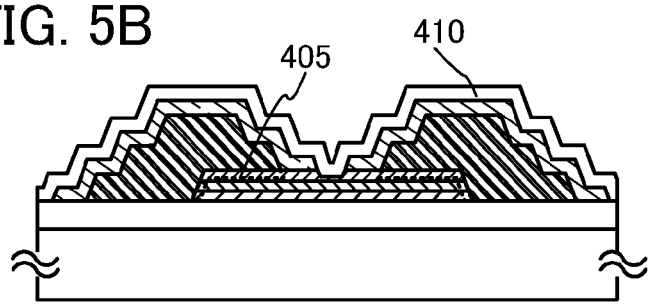
Figure 5C:
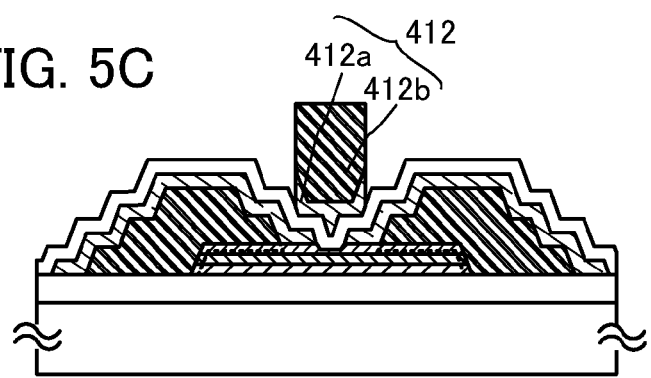

Next, the gate insulating layer 410 is formed over the oxide stack 404, the second source electrode layer 408a, and the second drain electrode layer 408b (see FIG. 5B). The gate insulating layer 410 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the gate insulating layer 410 may be a stacked layer of any of the above materials. The gate insulating layer 410 can be formed by a sputtering method, a CVD method, an MBE method, an ALD method, a PLD method, or the like. In particular, it is preferable that the gate insulating layer 410 be formed by a CVD method, further preferably a plasma CVD method, because favorable coverage can be obtained.

After the formation of the gate insulating layer 410, second heat treatment is preferably performed. By the second heat treatment, an impurity such as water or hydrogen contained in the gate insulating layer 410 can be desorbed (dehydration or dehydrogenation can be performed). The temperature of the second heat treatment is preferably higher than or equal to 300° C. and lower than or equal to 400° C. The second heat treatment may be performed in such a manner that heat treatment is performed in an inert gas atmosphere, and then another heat treatment is performed in an atmosphere containing an oxidizing gas at 10 ppm or more in order to compensate desorbed oxygen. By the second heat treatment, an impurity such as hydrogen or water can be removed from the gate insulating layer 410. In addition, further impurities such as hydrogen and water are removed from the oxide stack 404 in some cases. Further, when the heat treatment is performed in an atmosphere containing an oxidizing gas, oxygen can be supplied to the gate insulating layer 410.

Note that it is preferable that the second heat treatment be successively performed in a deposition chamber after the gate insulating layer 410 is formed. Alternatively, the heating at the time of forming the gate insulating layer 410 can serve as the second heat treatment.

Further, when the second heat treatment is performed in a state where the first source electrode layer 406a and the first drain electrode layer 406b are in contact with the oxide stack 404, oxygen in the oxide stack 404 is taken into the first source electrode layer 406a and the first drain electrode layer 406b which are easily bonded to oxygen. Accordingly, oxygen vacancies are generated in a region of the oxide stack 404 which is in the vicinity of an interface between the oxide stack 404 and each of the first source electrode layer 406a and the first drain electrode layer 406b, so that the n-type region 405 is formed. However, in some cases, the n-type region 405 is not formed depending on a temperature of the second heat treatment.

Next, a conductive film to be the gate electrode layer 412 is formed over the gate insulating layer 410. The conductive film can be formed by a sputtering method, or the like. The conductive film is etched so as to remain to overlap with the channel formation region, so that the gate electrode layer 412 is formed (see FIG. 5C).

In this embodiment, the gate electrode layer 412 has a stacked-layer structure including the first gate electrode layer 412a formed using a material similar to that of the second conductive film and the second gate electrode layer 412b formed using a material similar to that of the first conductive film.

Figure 5D:
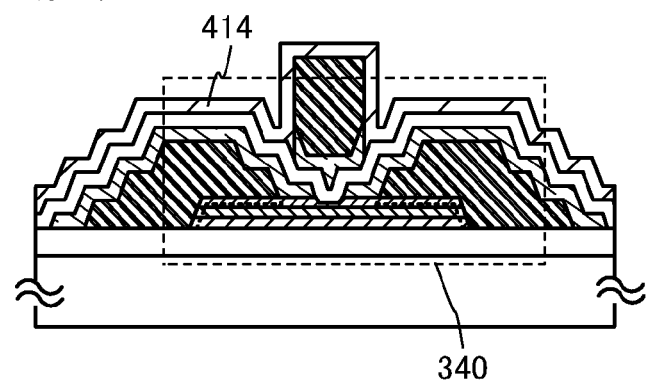

After that, the protective insulating layer 414 is formed over the gate insulating layer 410 and the gate electrode layer 412 (see FIG. 5D). As the protective insulating layer 414, an insulating layer having a lower oxygen-transmitting property (higher oxygen barrier property) than the gate insulating layer 410 is provided. As the protective insulating layer 414, a silicon nitride film or a silicon nitride oxide film can be provided, for example.

Note that it is preferable that the protective insulating layer 414 be formed by a sputtering method because the concentration of hydrogen in the protective insulating layer 414 is preferably reduced. The concentration of hydrogen in the protective insulating layer 414 is preferably lower than $5 \times 10^{19}$ cm$^{-3}$, more preferably lower than $5 \times 10^{18}$ cm$^{-3}$.

Third heat treatment is preferably performed after the protective insulating layer 414 is formed. The temperature of the third heat treatment is preferably higher than or equal to 350° C. and lower than or equal to 450° C. By the third heat treatment, oxygen is easily released from the base insulating layer 402 and the gate insulating layer 410, so that oxygen vacancies in the oxide stack 404 can be reduced.

Further, by the third heat treatment, oxygen might be transferred from the oxide stack 404 to the first source electrode layer 406a and the first drain electrode layer 406b which are bonded to oxygen easily. Accordingly, in some cases, more oxygen vacancies are generated in the n-type region 405. Alternatively, in the case where the region which is in the vicinity of the interface does not become an n-type region by the second heat treatment, the region can become the n-type region 405 by the third heat treatment.

In this manner, the transistor 340 in this embodiment can be fabricated.

Note that this embodiment can be combined as appropriate with any of the other embodiments and examples in this specification.

Embodiment 4

Figure 20A:
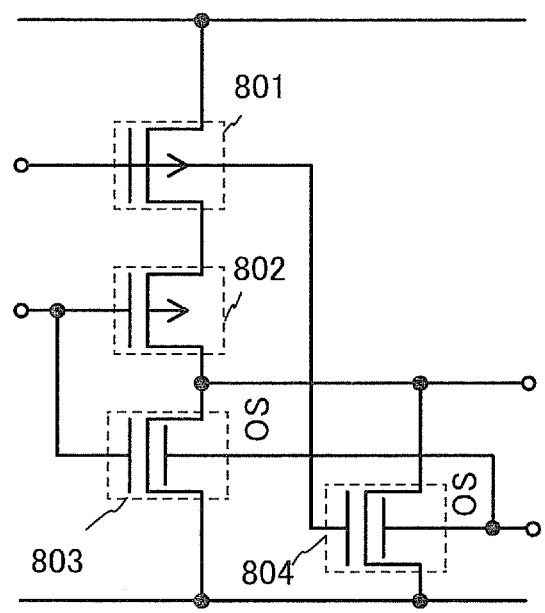
FIGS. 20A and 20B are circuit diagrams each illustrating a semiconductor device of one embodiment of the present invention.
Figure 20B:
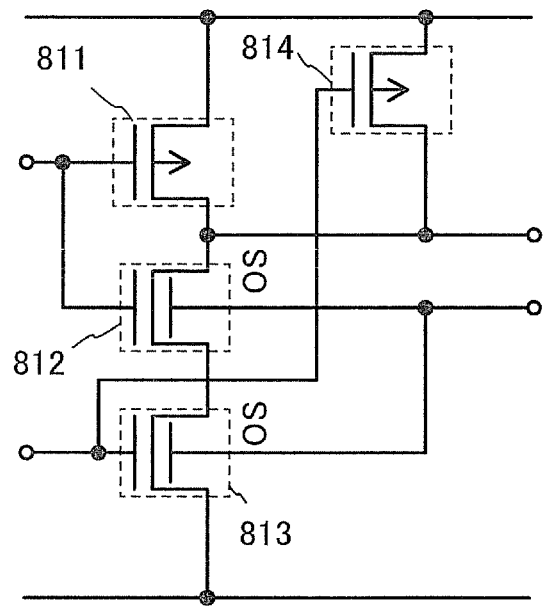

FIG. 20A illustrates an example of a circuit diagram of a NOR circuit, which is a logic circuit, as an example of the semiconductor device of one embodiment of the present invention. FIG. 20B illustrates a circuit diagram of a NAND circuit.

In the NOR circuit in FIG. 20A, p-channel transistors 801 and 802 are transistors in each of which a channel formation region is formed using a semiconductor material (e.g., silicon) other than an oxide semiconductor, and n-channel transistors 803 and 804 each include an oxide stack including an oxide semiconductor and each have a structure similar to any of the structures of the transistors described in Embodiment 2.

A transistor including a semiconductor material such as silicon can easily operate at high speed. In contrast, a transistor including an oxide semiconductor enables charge to be held for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be formed over the transistors 801 and 802 with an insulating layer provided therebetween.

Note that in the NOR circuit shown in FIG. 20A, the transistors 803 and 804 have a structure having a back gate electrode, and by controlling the potential of the back gate electrode, for example, by setting the potential to GND, the threshold voltages of the transistors 803 and 804 are increased, so that the transistors can be normally off.

In the NAND circuit in FIG. 20B, p-channel transistors 811 and 814 are transistors in each of which a channel formation region is formed using a semiconductor material (e.g., silicon) other than an oxide semiconductor, and n-channel transistors 812 and 813 each include an oxide stack containing an oxide semiconductor and each have a structure similar to any of the structures of the transistors described in Embodiment 2.

Note that in the NAND circuit shown in FIG. 20B, the transistors 812 and 813 have a structure having a back gate electrode, and by controlling the potential of the back gate electrode, for example, by setting the potential to GND, the threshold voltages of the transistors 812 and 813 are increased, so that the transistors can be normally off.

As in the NOR circuit shown in FIG. 20A, to miniaturize the logic circuit, it is preferable that the n-channel transistors 812 and 813 be stacked over the p-channel transistors 811 and 814.

By applying a transistor including an oxide semiconductor for a channel formation region and having extremely low off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for fabricating the semiconductor device can be provided.

In addition, by employing any of the structures of the transistors described in Embodiment 2, a NOR circuit and a NAND circuit with high reliability and stable characteristics can be provided.

Examples of a NOR circuit and a NAND circuit using the transistor in Embodiment 2 are described as an example in this embodiment; however, there is no particular limitation to the circuits and an AND circuit, an OR circuit, or the like can be formed.

The methods and structures described in this embodiment can be combined as appropriate with any of the methods and structures described in the other embodiments.

Embodiment 5

In this embodiment, an example of a semiconductor device (memory device) which includes any of the transistors described in Embodiment 2, which can retain stored data even when not powered, and which has an unlimited number of write cycles will be described with reference to drawings.

Figure 21A:
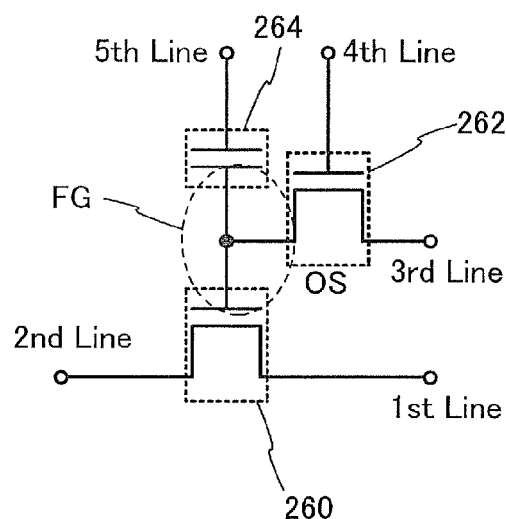
FIGS. 21A to 21C are circuit diagrams and a conceptual diagram of a semiconductor device of one embodiment of the present invention.

FIG. 21A is a circuit diagram illustrating the semiconductor device of this embodiment.

A transistor including a semiconductor material (e.g., silicon) other than an oxide semiconductor can be applied to a transistor 260 illustrated in FIG. 21A and thus the transistor 260 can easily operate at high speed. Further, charge can be held in a transistor 262 to which a structure similar to that of any of the transistors each including an oxide semiconductor layer described in Embodiment 2 can be applied for a long time owing to its characteristics.

Although all the transistors are n-channel transistors here, p-channel transistors can also be used as the transistors used for the semiconductor device described in this embodiment.

In FIG. 21A, a first wiring (a 1st Line) is electrically connected to a source electrode layer of the transistor 260. A second wiring (a 2nd Line) is electrically connected to a drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of the capacitor 264. A fifth wiring (5th Line) and the other electrode of the capacitor 264 are electrically connected to each other.

The semiconductor device in FIG. 21A utilizes a characteristic in which the potential of the gate electrode layer of the transistor 260 can be held, and thus enables data writing, storing, and reading of data as follows.

Writing and storing of data are described. First, the potential of the fourth wiring is set to a potential at which the transistor 262 is turned on, so that the transistor 262 is turned on. Accordingly, the potential of the third wiring is applied to the gate electrode layer of the transistor 260 and the capacitor 264. That is, a predetermined charge is supplied to the gate electrode layer of the transistor 260 (writing). Here, one of two kinds of charges providing different potential levels (hereinafter referred to as a low-level charge and a high-level charge) is supplied. After that, the potential of the fourth wiring is set to a potential at which the transistor 262 is turned off, so that the transistor 262 is turned off. Thus, the charge supplied to the gate electrode layer of the transistor 260 is held (holding). That is, the data is held in a floating gate (FG).

Since the off-state current of the transistor 262 is extremely low, the charge of the gate electrode layer of the transistor 260 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where the high-level charge is given to the gate electrode layer of the transistor 260 is lower than an apparent threshold voltage $V_{th\_L}$ in the case where the low-level charge is given to the gate electrode layer of the transistor 260. Here, an apparent threshold voltage refers to the potential of the fifth wiring which is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where the high-level charge is supplied in writing, when the potential of the fifth wiring is $V_0$ ($>V_{th\_H}$), the transistor 260 is turned on. In the case where the low-level charge is supplied in writing, even when the potential of the fifth wiring is $V_0$ ($<V_{th\_L}$), the transistor 260 remains off. Therefore, the data stored in the floating gate (FG) can be read by determining the potential of the second wiring.

Note that in the case where memory cells are arrayed to be used, it is necessary that only data of a desired memory cell be able to be read. The fifth wiring in the case where data is not read may be supplied with a potential at which the transistor 260 is turned off regardless of the state of the gate electrode layer, that is, a potential lower than $V_{th\_H}$. Alternatively, the fifth wiring may be supplied with a potential at which the transistor 260 is turned on regardless of the state of the gate electrode layer, that is, a potential higher than $V_{th\_L}$.

Figure 21B:
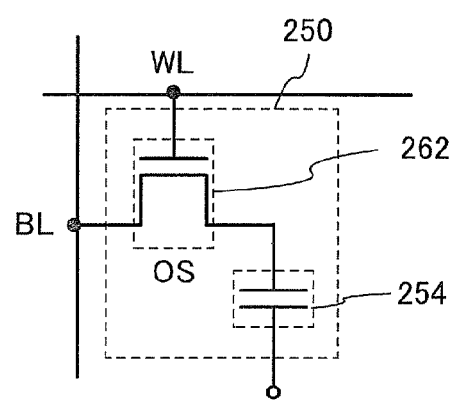
Figure 21C:
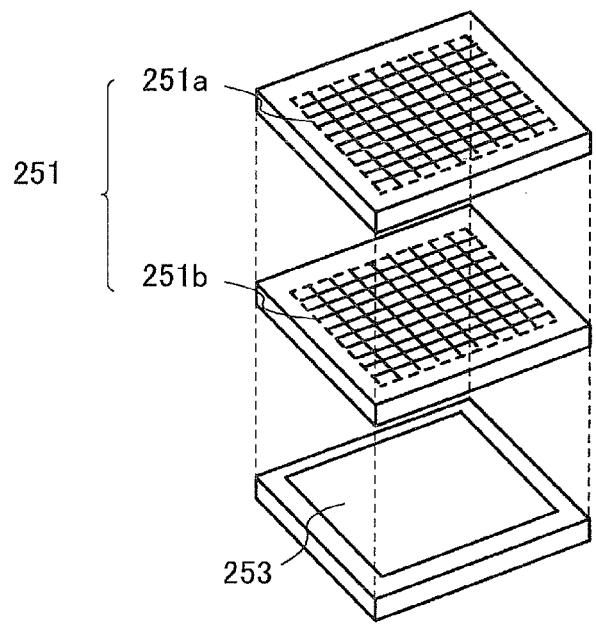

FIG. 21B illustrates another example of one embodiment of a structure of a memory device. FIG. 21B illustrates an example of a circuit configuration of a semiconductor device, and FIG. 21C is a conceptual diagram illustrating an example of a semiconductor device. First, the semiconductor device illustrated in FIG. 21B is described, and then, the semiconductor device illustrated in FIG. 21C is described.

In the semiconductor device illustrated in FIG. 21B, a bit line BL is electrically connected to the source electrode or the drain electrode of the transistor 262, a word line WL is electrically connected to the gate electrode layer of the transistor 262, and the source electrode or the drain electrode of the transistor 262 is electrically connected to a first terminal of a capacitor 254.

Here, the transistor 262 including an oxide semiconductor has extremely low off-state current. For that reason, the potential of the first terminal of the capacitor 254 (or a charge accumulated in the capacitor 254) can be held for an extremely long time by turning off the transistor 262.

Next, writing and storing of data in the semiconductor device (a memory cell 250) illustrated in FIG. 21B are described.

First, the potential of the word line WL is set to a potential at which the transistor 262 is turned on, so that the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely low, the potential of the first terminal of the capacitor 254 (or the charge accumulated in the capacitor) can be held for a long time.

Next, reading of data is described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ $(=(C_B \times V_{B0} + C \times V_1)/(C_B + C))$ is higher than the potential of the bit line BL in the case of holding the potential $V_0$ $(=(C_B \times V_{B0} + C \times V_0)/(C_B + C))$.

Then, by comparing the potential of the bit line BL with a predetermined potential, data can be read.

As described above, the semiconductor device illustrated in FIG. 21B can hold charge that is accumulated in the capacitor 254 for a long time because the off-state current of the transistor 262 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 21C is described.

The semiconductor device illustrated in FIG. 21C includes a memory cell array 251 (memory cell arrays 251a and 251b) including the plurality of memory cells 250 illustrated in FIG. 21B as memory circuits in the upper portion, and a peripheral circuit 253 in the lower portion, which is necessary for operating the memory cell array 251 (the memory cell arrays 251a and 251b). Note that the peripheral circuit 253 is electrically connected to the memory cell array 251.

In the structure illustrated in FIG. 21C, the peripheral circuit 253 can be provided under the memory cell array 251 (the memory cell arrays 251a and 251b). Thus, the size of the semiconductor device can be reduced.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 21C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

When a transistor including an oxide semiconductor in a channel formation region is used as the transistor 262, stored data can be retained for a long period. In other words, power consumption can be sufficiently reduced because a semiconductor device in which refresh operation is unnecessary or the frequency of refresh operation is extremely low can be provided.

Further, the semiconductor device described in this embodiment is the semiconductor device described in Embodiment 1 which includes an oxide stack and in which an oxide semiconductor layer where a channel is formed is apart from a surface of the oxide stack. Thus, a highly reliable semiconductor device that exhibits stable electrical characteristics can be obtained.

Embodiment 6

In this embodiment, examples of application of the semiconductor device described in any of the above embodiments to electronic devices such as a mobile phone, a smartphone, and an e-book reader will be described with reference to FIG. 22, FIG. 23, FIG. 24, and FIGS. 25A and 25B.

Figure 22:
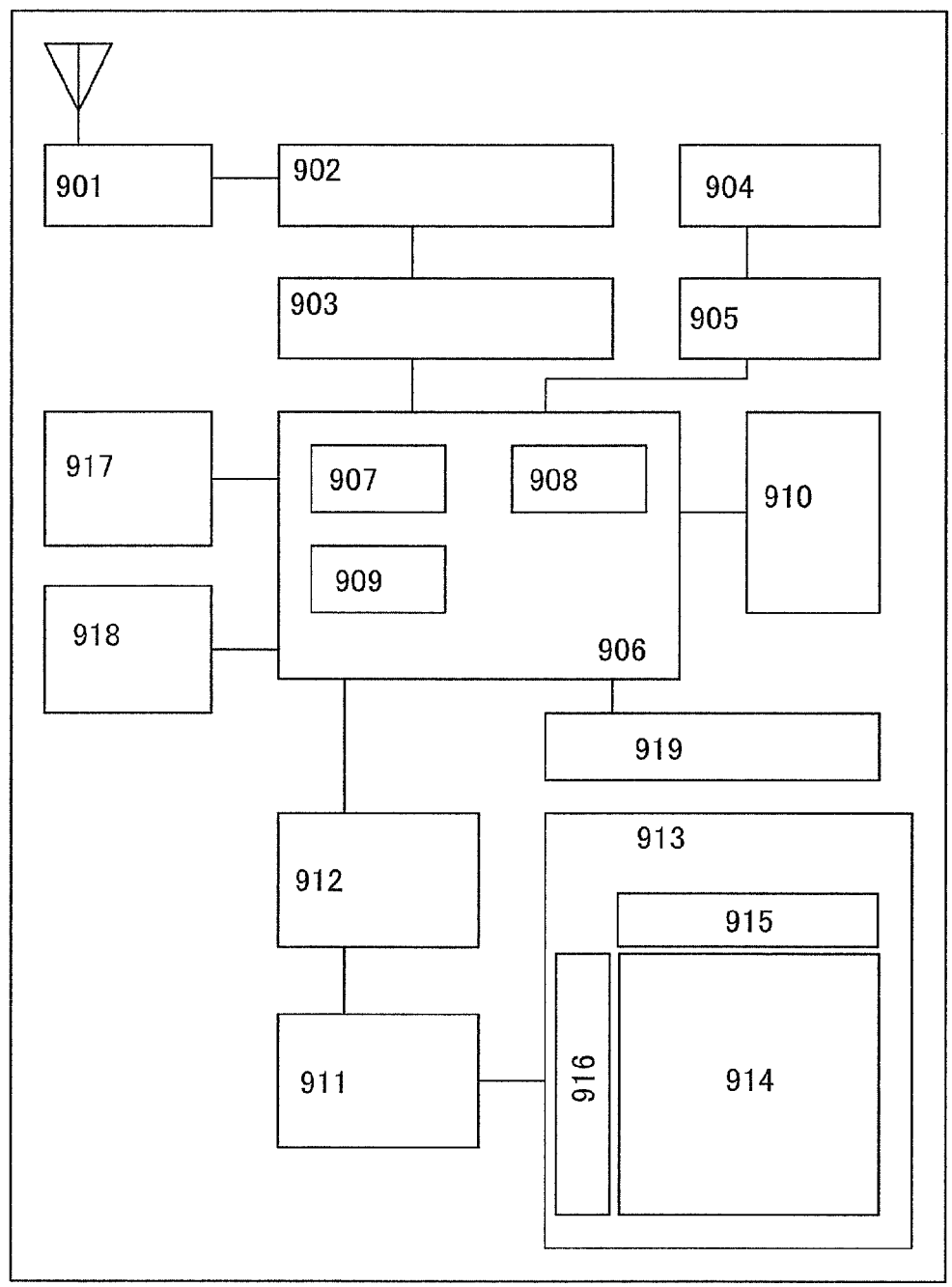
FIG. 22 is a block diagram of a semiconductor device of one embodiment of the present invention.

FIG. 22 is a block diagram of an electronic device. An electronic device illustrated in FIG. 22 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, it is possible to provide an electronic device in which writing and reading of data can be performed at high speed, data can be held for a long period, power consumption is sufficiently reduced, and the reliability is high.

Figure 23:
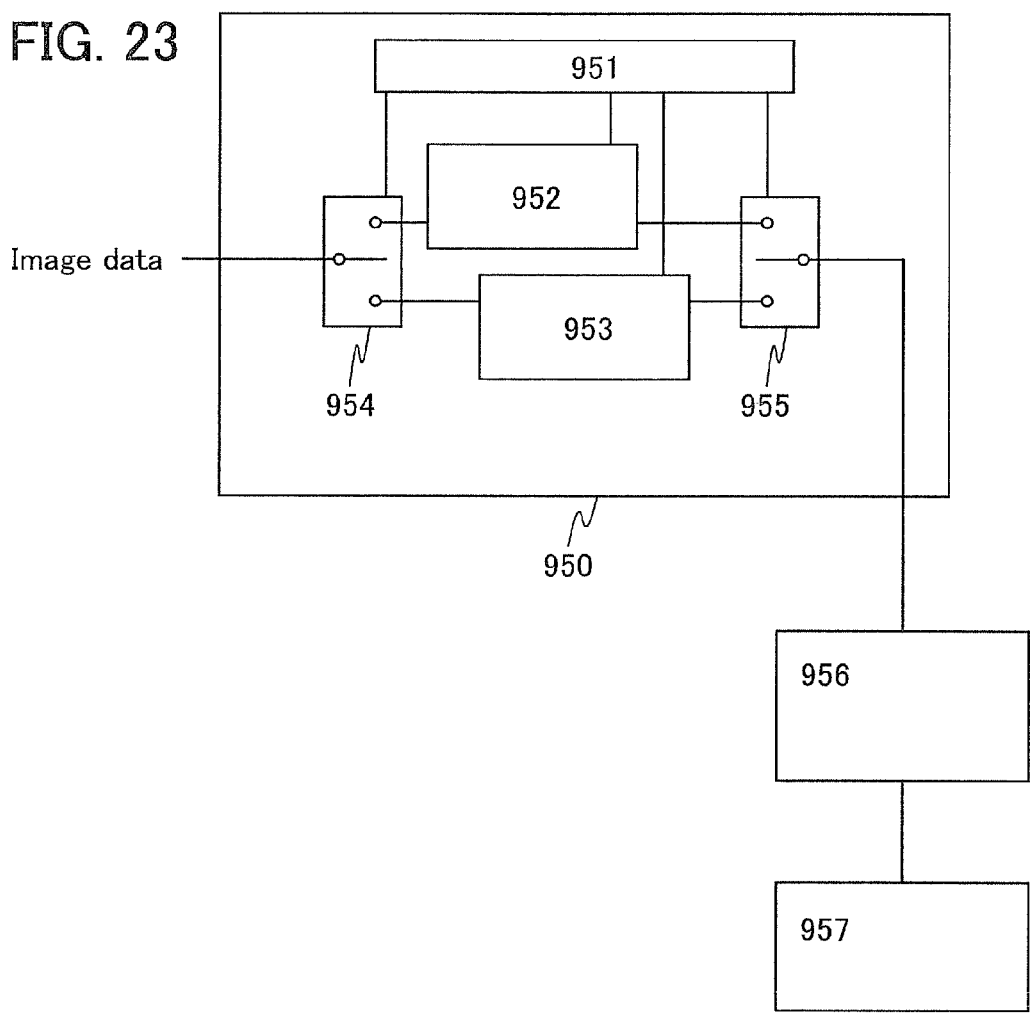
FIG. 23 is a block diagram of a semiconductor device of one embodiment of the present invention.

FIG. 23 illustrates an example in which any of the semiconductor devices described in the above embodiments is used for a memory circuit 950 in a display. The memory circuit 950 illustrated in FIG. 23 includes a memory 952, a memory 953, a switch 954, a switch 955, and a memory controller 951. Further, in the memory circuit, a signal line from image data (input image data), a display controller 956 which reads and controls data held in the memories 952 and 953(stored image data), and a display 957 which displays data by a signal from the display controller 956 are connected.

First, image data (input image data A) is formed by an application processor (not shown). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long period, and power consumption can be sufficiently reduced. Further, a semiconductor device which is hardly affected by entry of water, moisture, and the like from the outside and which has high reliability can be provided.

Figure 24:
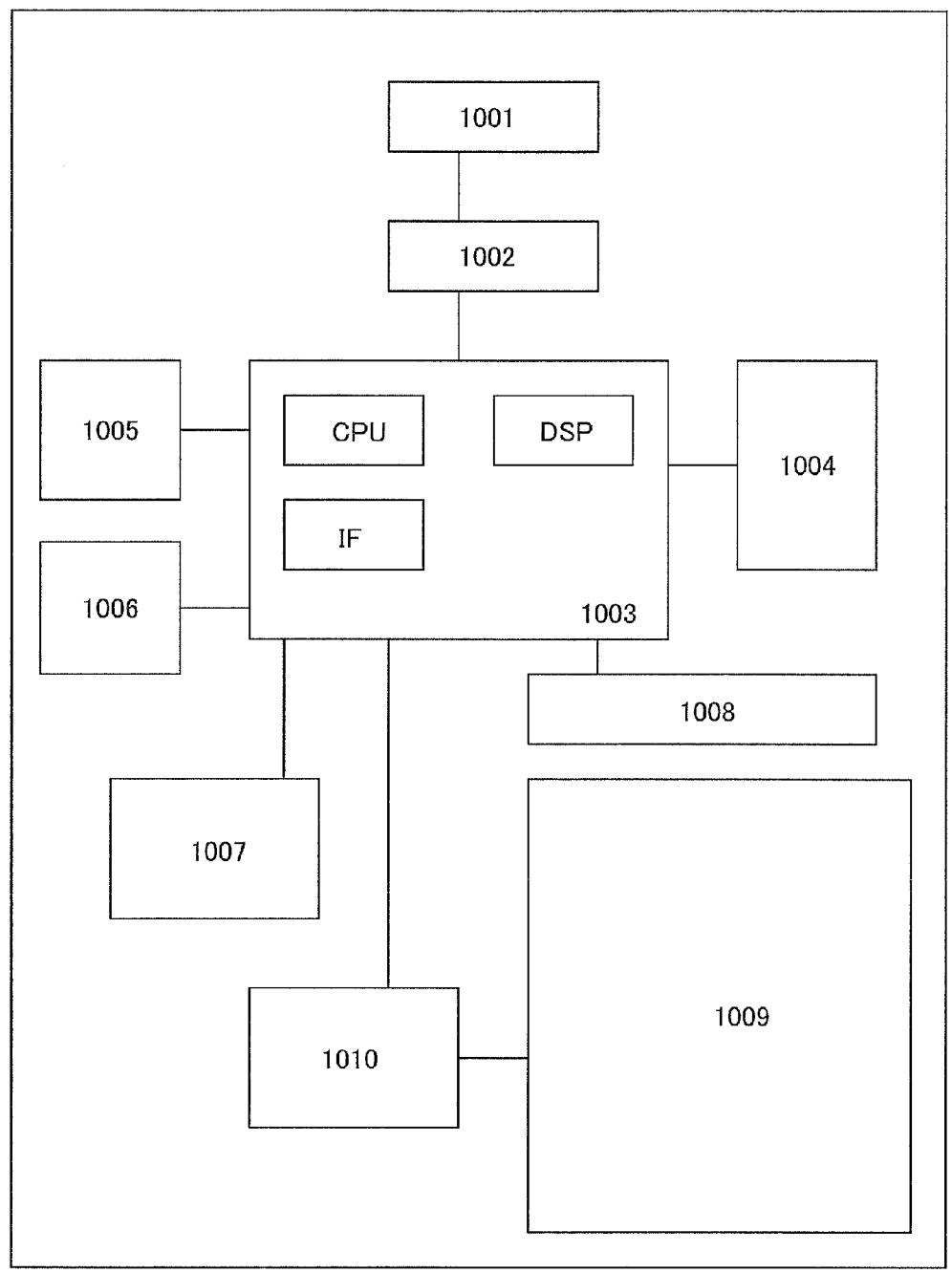
FIG. 24 is a block diagram of a semiconductor device of one embodiment of the present invention.

FIG. 24 is a block diagram of an e-book reader. FIG. 24 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, any of the semiconductor devices described in the above embodiments can be used for the memory circuit 1007 in FIG. 24. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a short time, the data may be stored in the memory circuit 1007. In order to store the data for a long period, the data stored in the memory circuit 1007 may be copied to the flash memory 1004. Also in such a case, by employing the semiconductor device described in any of the above embodiments, data can be written and read at high speed and held for a long period, and power consumption can be sufficiently reduced. Further, a semiconductor device which is hardly affected by entry of water, moisture, and the like from the outside and which has high reliability can be provided.

Figure 25A:
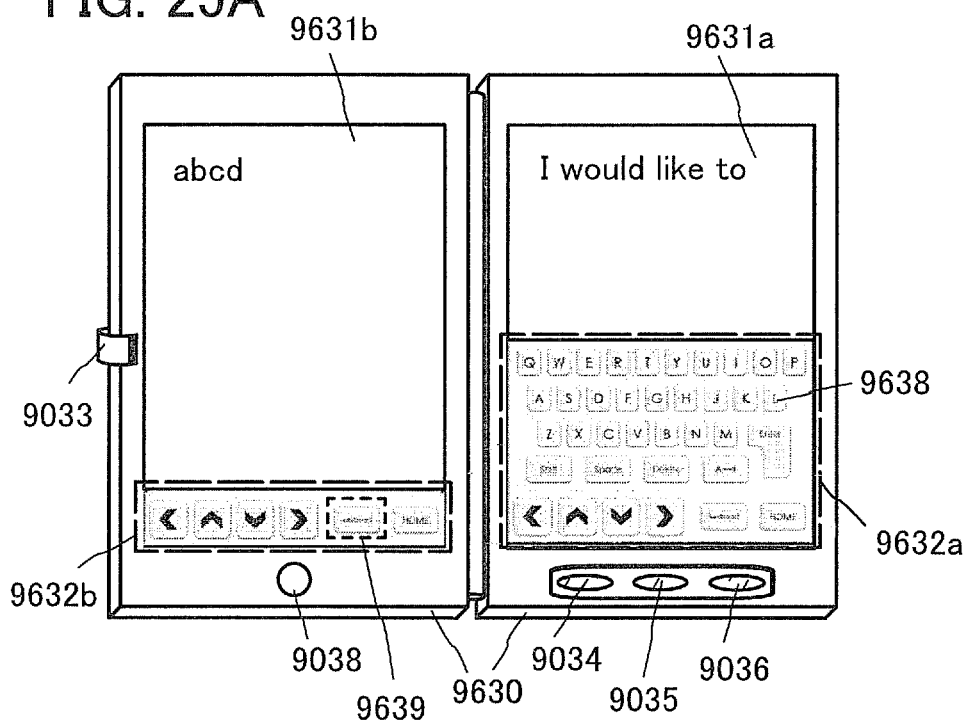
FIGS. 25A and 25B are views illustrating an electronic device in which a semiconductor device of one embodiment of the present invention can be used.
Figure 25B:
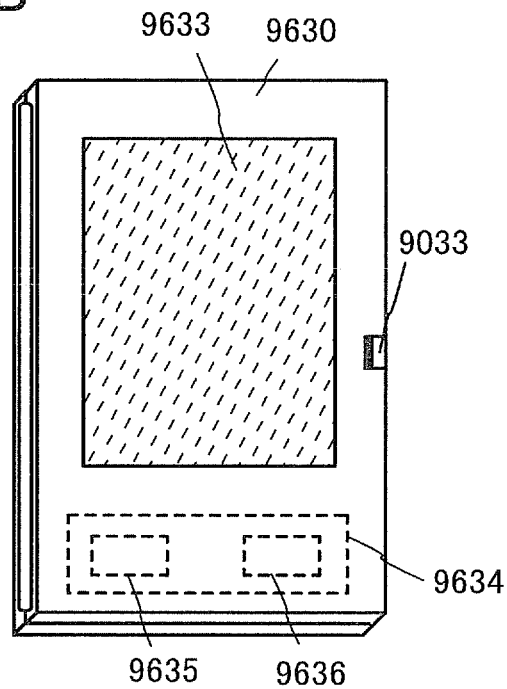

FIGS. 25A and 25B illustrate a specific example of an electronic device. FIGS. 25A and 25B illustrate a foldable tablet terminal FIG. 25A illustrates the tablet terminal in the state of being unfolded. The tablet terminal includes a housing 9630, a display portion 9631*a*, a display portion 9631*b*, a display-mode switching button 9034, a power switch 9035, a power-saving-mode switching button 9036, a fastener 9033, and an operation switch 9038.

Any of the semiconductor devices described in the above embodiments can be used for the display portion 9631*a* and the display portion 9631*b*, so that the tablet terminal can have high reliability. In addition, the memory device described in the above embodiment may be applied to any of the semiconductor devices of this embodiment.

Part of the display portion 9631*a* can be a touch panel region 9632*a*, and data can be input by touching operation keys 9638 that are displayed. Although a structure in which a half region in the display portion 9631*a* has only a display function and the other half region also has a touch panel function is shown as an example, the display portion 9631*a* is not limited to the structure. For example, the display portion 9631*a* can display keyboard buttons in the whole region to be a touch panel, and the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel regions 9632*a* and 9632*b*.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Note that FIG. 25A shows an example in which the display portion 9631*a* and the display portion 9631*b* have the same display area; however, one embodiment of the present invention is not limited and one of the display portions may be different from the other display portion in size and display quality. For example, one of them may be a display panel that can display higher-definition images than the other.

The tablet terminal is closed in FIG. 25B. The tablet terminal includes the housing 9630, a solar cell 9633, a charge and discharge control circuit 9634, a battery 9635, and a DCDC converter 9636. Note that FIG. 25B illustrates an example in which the charge and discharge control circuit 9634 includes the battery 9635 and the DC-DC converter 9636.

Since the tablet terminal can be folded in two, the housing 9630 can be closed when the tablet terminal is not in use. Thus, the display portions 9631*a* and 9631*b* can be protected, thereby providing a tablet terminal with high endurance and high reliability for long-term use.

In addition, the tablet terminal illustrated in FIGS. 25A and 25B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, methods, and the like described in this embodiment can be combined as appropriate with any of the structures and methods described in the other embodiments.

Example 1

In this example, a conductive film was formed over an oxide semiconductor film and transfer of elements which exist between the stacked films was examined by SIMS, and results thereof will be described.

Figure 11A:
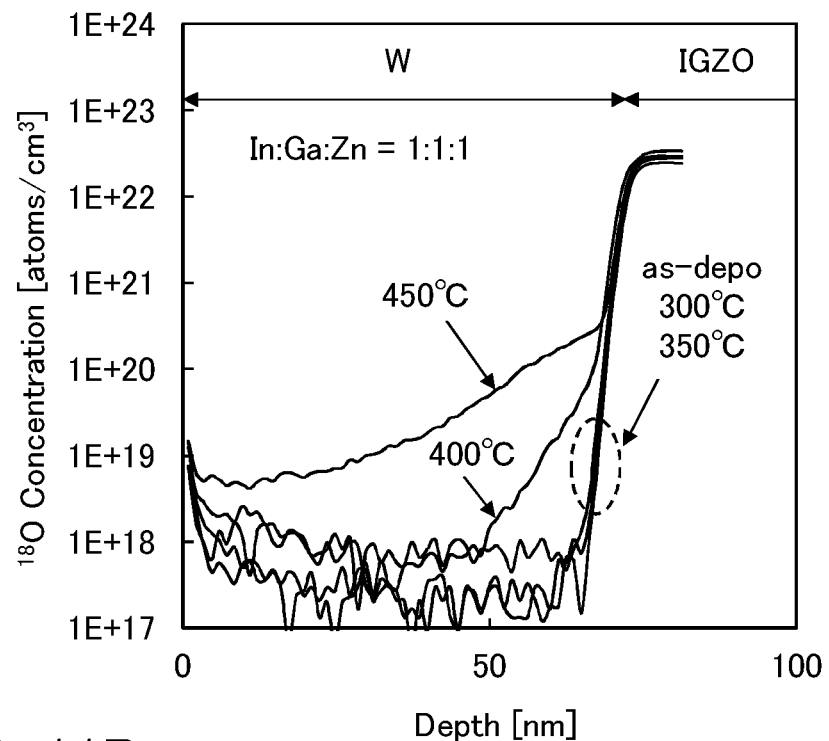
FIGS. 11A and 11B show SIMS measurement results.
Figure 11B:
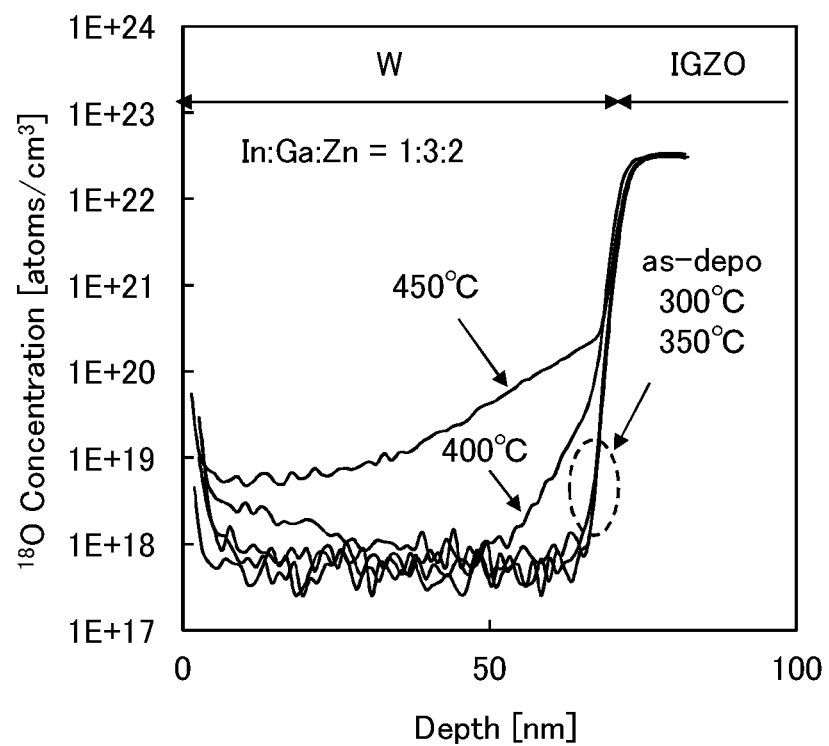

FIGS. 11A and 11B each show analysis results of profiles of an oxygen isotope ($^{18}O$) in a depth direction by SIMS before and after heat treatment in samples which were each fabricated with a stack of an IGZO film and a tungsten film by a sputtering method. Note that the IGZO film was formed by a DC sputtering method with a sputtering target containing In, Ga, and Zn at an atomic ratio of 1:1:1 or 1:3:2 and a deposition gas containing Ar and $O_2$ ($^{18}O$) at a flow rate ratio of 2:1. The tungsten film was formed by a DC sputtering method with a tungsten sputtering target and a 100 percent Ar gas used as a deposition gas. Note that heat treatment was performed at 300° C., 350° C., 400° C., and 450° C. each for one hour, and five samples including a sample which was not subjected to heat treatment were compared with one another.

Here, the IGZO film formed with the sputtering target containing In, Ga, and Zn at an atomic ratio of 1:1:1 is crystalline, and the IGZO film formed with the sputtering target containing In, Ga, and Zn at an atomic ratio of 1:3:2 is amorphous.

As shown in FIGS. 11A and 11B, as the temperature of the heat treatment is increased, oxygen of the oxide semiconductor film is taken into the tungsten film despite the composition (crystallinity) of the oxide semiconductor film.

Since the fabrication process of the transistor involves some heat treatment steps, oxygen vacancies are generated in a region of the oxide semiconductor layer, which is in contact with the source electrode or the drain electrode, and the region becomes an n-type. Thus, the n-type region can serve as a source or a drain of the transistor.

Figure 12A:
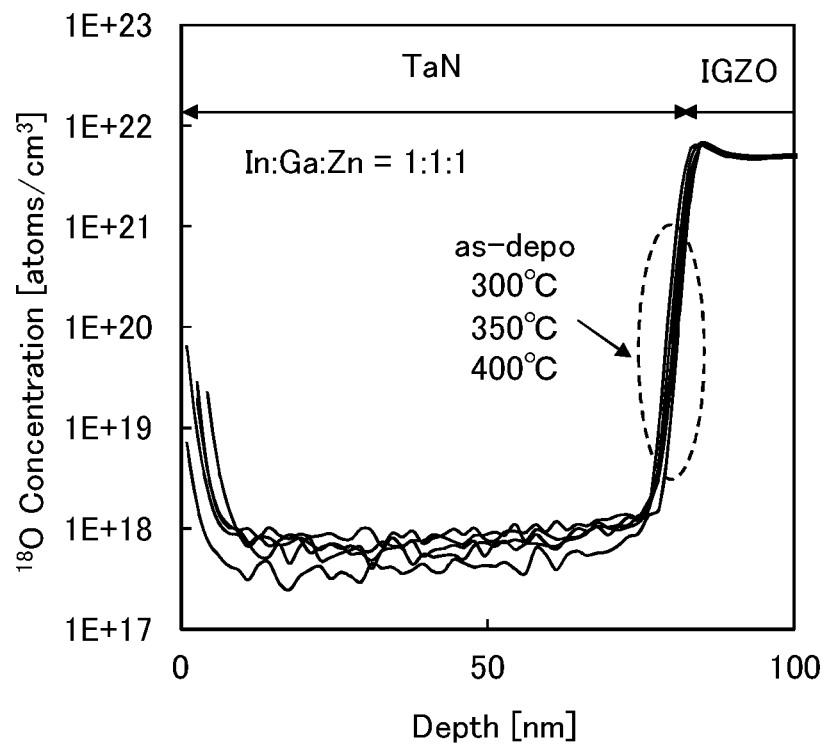
FIGS. 12A and 12B show SIMS measurement results.
Figure 12B:
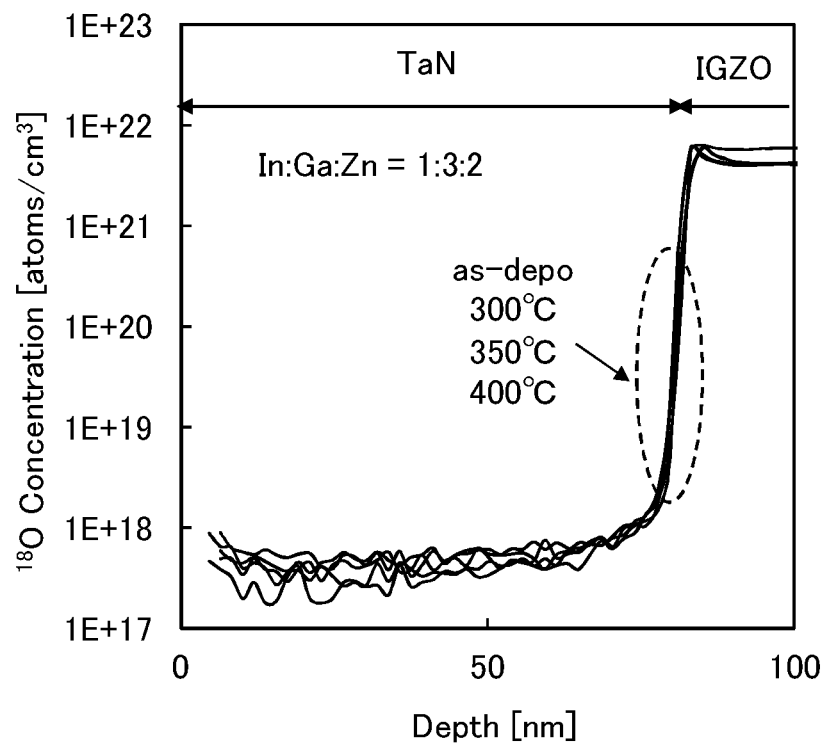

FIGS. 12A and 12B each show the analysis results by SIMS in samples which were each fabricated using a tantalum nitride film instead of the tungsten film. The tantalum nitride film was formed by a reactive sputtering method (a DC sputtering method) with a tantalum sputtering target and a deposition gas containing Ar and $N_2$ at a flow rate ratio of 5:1. Note that heat treatment was performed under four conditions similar to the above, and five samples including a sample which was not subjected to heat treatment were compared with one another.

FIG. 12A shows the analysis results by SIMS in samples which were each fabricated with a stack of the IGZO film whose atomic ratio of In to Ga and Zn was 1:1:1 and the tantalum nitride film. In any of the samples, oxygen transferred to the tantalum nitride film (oxygen taken thereinto) was not observed and its behavior was different from that of the sample with the tungsten film in FIG. 11A. FIG. 12B shows the analysis results by SIMS in samples which were each formed with a stack of the IGZO film whose atomic ratio of In to Ga and Zn was 1:3:2 and the tantalum nitride film. In any of the samples, oxygen transferred to the tantalum nitride film (oxygen taken thereinto) was not observed and its behavior was different from that of the sample with the tungsten film in FIG. 11B. Accordingly, it can be said that the tantalum nitride film is a film that is not easily bonded to oxygen or a film which does not take oxygen therein easily.

Figure 13A:
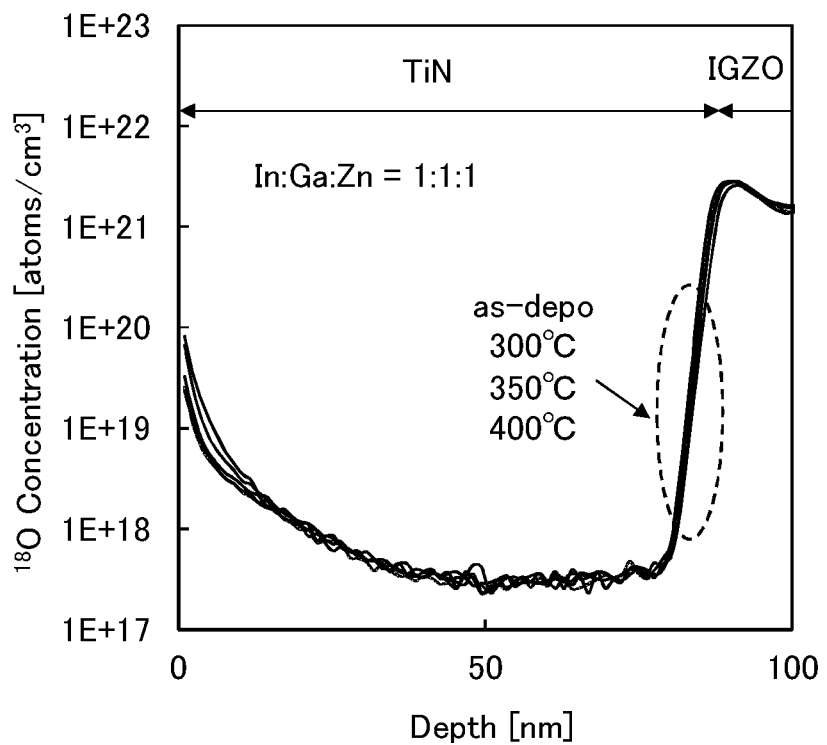
FIGS. 13A and 13B show SIMS measurement results.
Figure 13B:
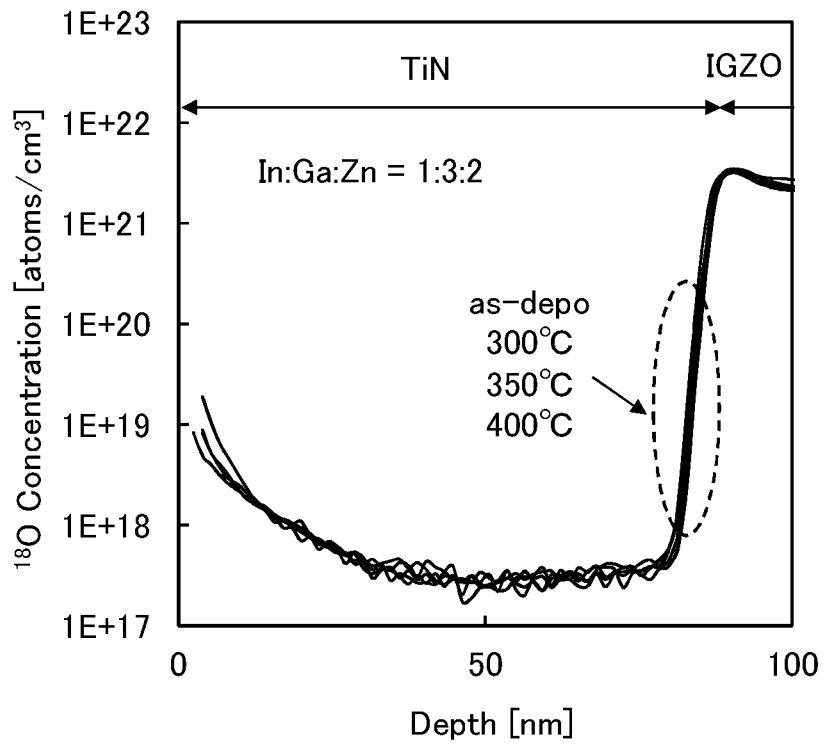

FIGS. 13A and 13B each show the analysis results by SIMS in samples which were each fabricated using a titanium nitride film instead of the tungsten film. The titanium nitride film was formed by a reactive sputtering method (a DC sputtering method) with a titanium sputtering target and a 100 percent $N_2$ gas used as a deposition gas. Note that heat treatment was performed under four conditions similar to the above, and five samples including a sample which was not subjected to heat treatment were compared with one another.

FIG. 13A shows the analysis results by SIMS in samples which were each fabricated with a stack of the IGZO film whose atomic ratio of In to Ga and Zn was 1:1:1 and the titanium nitride film. In either sample, oxygen transferred to the titanium nitride film (oxygen taken thereinto) was not observed and its behavior was different from that of the sample with the tungsten film in FIG. 11A. FIG. 13B shows the analysis results by SIMS in samples which were each fabricated with a stack of the IGZO film whose atomic ratio of In to Ga and Zn was 1:3:2 and the titanium nitride film. In either sample, oxygen transferred to the titanium nitride film (oxygen taken thereinto) was not observed and its behavior was different from that of the sample with the tungsten film in FIG. 11B. Accordingly, it can be said that the titanium nitride film is a film that is not easily bonded to oxygen or a film which does not take oxygen therein easily.

Next, transfer of an impurity to an IGZO film was examined by SIMS analysis, and results thereof is described.

Figure 14A:
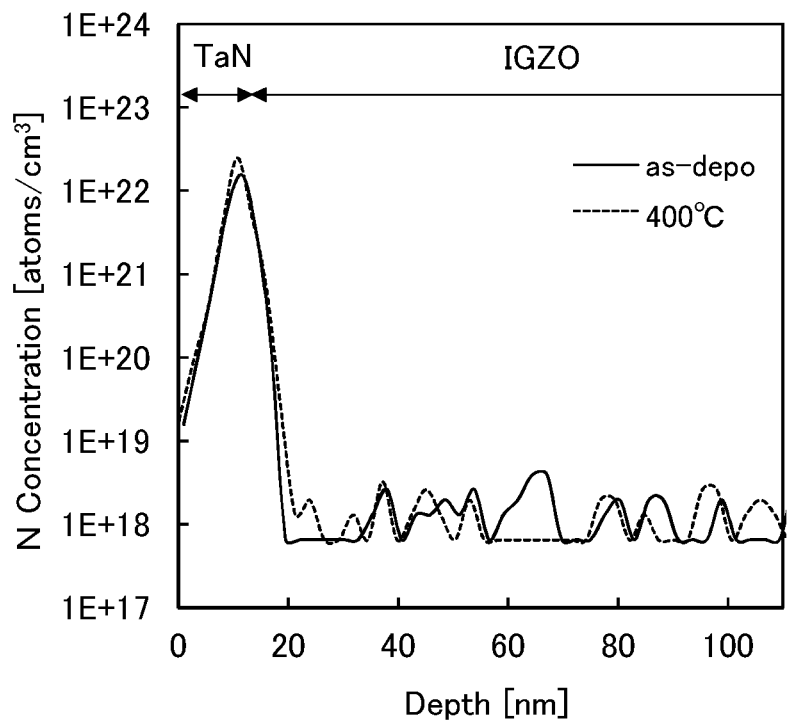
FIGS. 14A and 14B show SIMS measurement results.
Figure 14B:
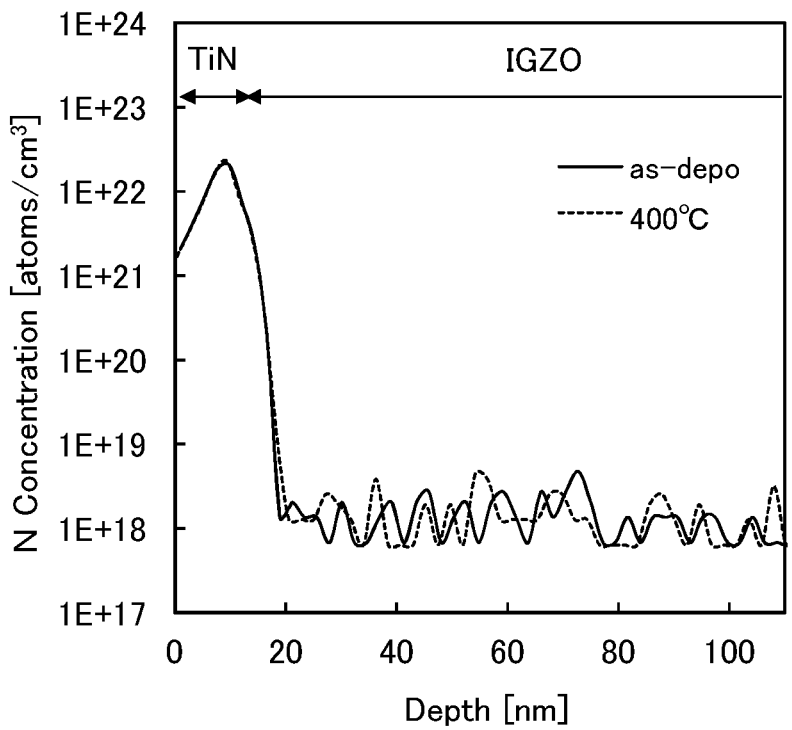

FIGS. 14A and 14B each show analysis results of profiles of nitrogen in a depth direction by SIMS before and after heat treatment in samples which were each fabricated with a tantalum nitride film or a titanium nitride film formed over an IGZO film by a sputtering method. Note that the IGZO film was formed by a DC sputtering method with a sputtering target containing In, Ga, and Zn at an atomic ratio of 1:1:1 and a deposition gas containing Ar and $O_2$ at a flow rate ratio of 2:1. The tantalum nitride film and the titanium nitride film were formed by the above method. Note that heat treatment was performed at 400° C. for one hour, and two samples including a sample which was not subjected to heat treatment were compared with each other.

As shown in FIGS. 14A and 14B, in either sample, transfer of nitrogen to the IGZO film was not observed. Therefore, nitrogen which serves as a donor in the IGZO film is not widely transferred to the IGZO film from the tantalum nitride film or the titanium nitride film; accordingly, a channel formation region of the transistor is not made to have n-type conductivity.

Figure 15A:
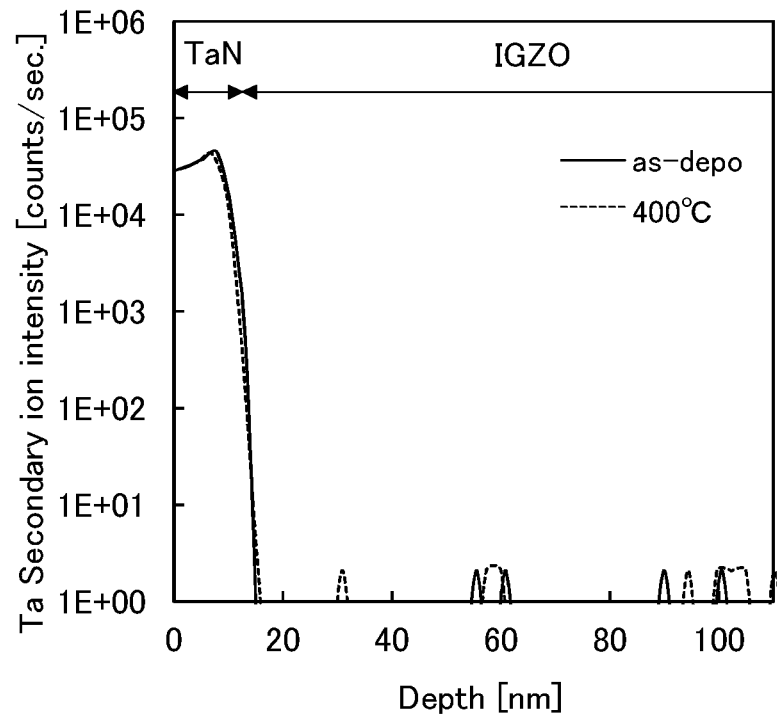
FIGS. 15A and 15B show measurement results of sheet resistances.
Figure 15B:
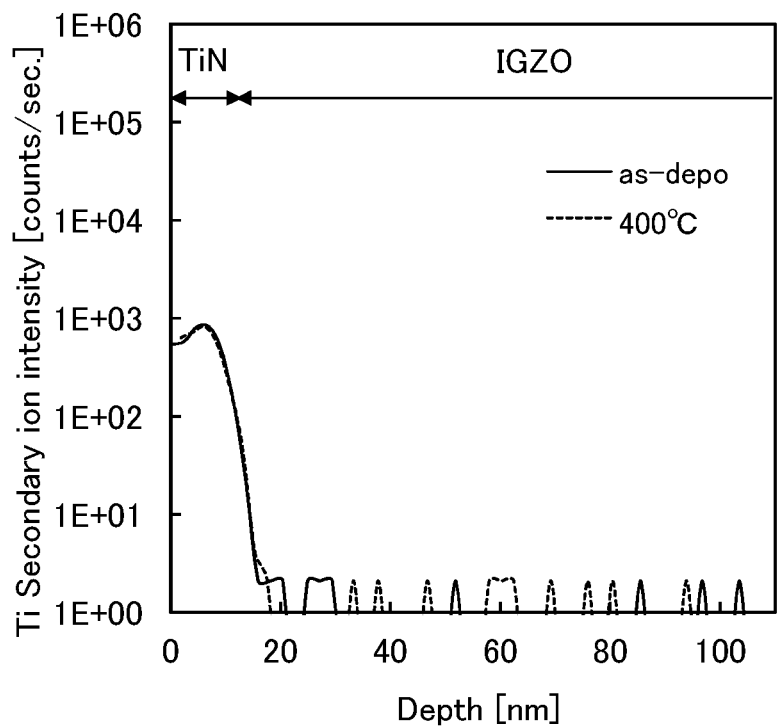

FIGS. 15A and 15B show SIMS analysis results of profiles of tantalum and titanium, respectively, in a depth direction in samples similar to those shown in FIGS. 14A and 14B as examples. As shown in FIGS. 15A and 15B, transfer of tantalum or titanium to the IGZO film was not observed. Accordingly, each of titanium and tantalum which might serve as an impurity affecting the electrical characteristics of the transistor is not widely transferred to the IGZO film from the tantalum nitride film or the titanium nitride film.

The above results showed that a film of a conductive nitride such as tantalum nitride or titanium nitride is a film that is not easily bonded to oxygen or a film which does not take oxygen therein easily, and nitrogen and a metal element in such a conductive nitride are not easily transferred to the oxide semiconductor film.

Note that this example can be combined as appropriate with any of embodiments or the other examples in this specification.

Example 2

In this example, measurement results of sheet resistance values of an oxide semiconductor film after removal of a conductive film which was formed over the oxide semiconductor film will be described.

Figure 16:
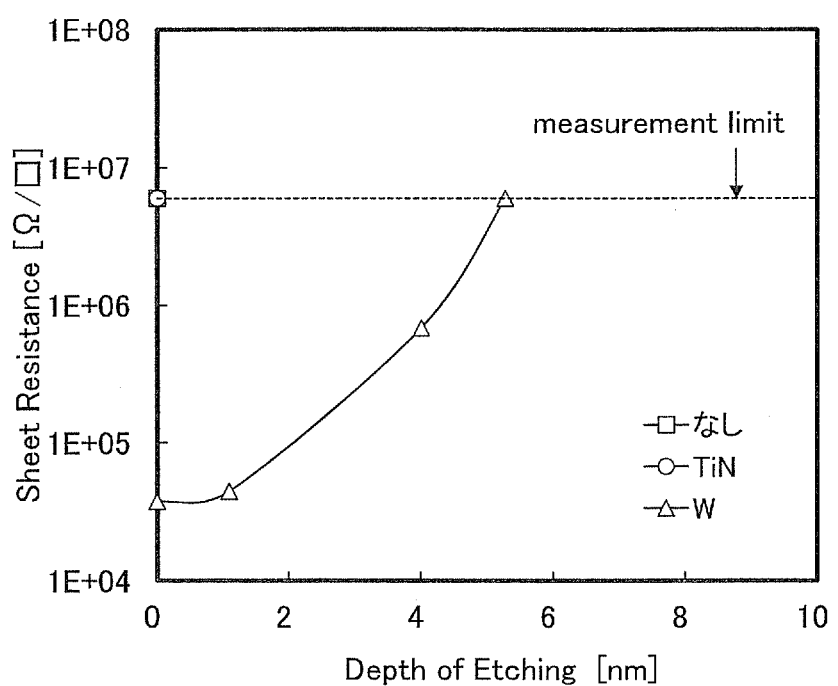
FIG. 16 shows a measurement result of sheet resistance.

FIG. 16 shows measurement results of sheet resistance values of samples each fabricated as follows with respect to a depth to which an IGZO film was etched: the IGZO film was formed by a sputtering method, a tungsten film or a titanium nitride film was stacked over the IGZO film by a sputtering method, and then the tungsten film or the titanium nitride film was removed. For comparison, a sample in which a conductive film was not formed over the IGZO film was also fabricated. Note that the IGZO film was formed by a DC sputtering method with a sputtering target containing In, Ga, and Zn at an atomic ratio of 1:1:1 and a deposition gas containing Ar and $O_2$ ($^{18}O$) at a flow rate ratio of 2:1. The tungsten film was formed by a DC sputtering method with a tungsten sputtering target and a 100 percent Ar gas used as a deposition gas. The titanium nitride film was formed by a reactive sputtering method (a DC sputtering method) with a titanium sputtering target and a 100 percent $N_2$ gas used as a deposition gas. The tungsten film and the titanium nitride film were etched using hydrogen peroxide water. The IGZO film was etched using a mixed solution of hydrogen peroxide water and ammonia. The remaining thickness of the IGZO film after the etching was measured using spectroscopic ellipsometry before and after the etching in order to obtain the depth to which the IGZO film was etched.

In the sample in which the tungsten film was formed over the IGZO film, the resistance of a region of the IGZO film, which was formed to a depth of about 5 nm from the surface of the IGZO film, was reduced as shown in FIG. 16. This suggests that a low-resistant mixed layer of IGZO and tungsten is formed in a region of the IGZO film, which is close to the surface thereof, and that an n-type region is formed due to oxygen vacancies which exist in the above region by oxygen in the IGZO film which is taken into the tungsten film, for example.

On the other hand, in the sample in which the titanium nitride film was formed over the IGZO film and the sample in which a conductive film was not formed over the IGZO film, the resistance of each of the IGZO films was not reduced. This suggests that elements of titanium nitride are not easily taken in the IGZO film and that oxygen of the IGZO film is not easily taken in the titanium nitride film, for example.

Figure 17A:
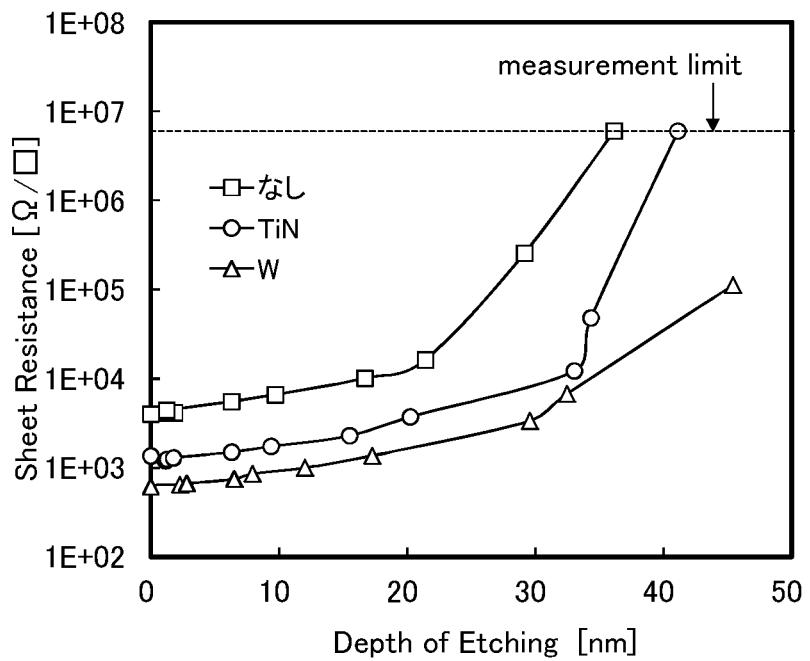
FIGS. 17A and 17B show measurement results of sheet resistances.

FIG. 17A shows measurement results of sheet resistance values of samples each fabricated as follows with respect to a depth to which an IGZO film was etched: the IGZO film was formed by a sputtering method, a tungsten film or a titanium nitride film was stacked over the IGZO film by a sputtering method, heat treatment was performed, and then the tungsten film or the titanium nitride film was removed. For comparison, a sample in which a conductive film was not formed over the IGZO film was also fabricated. Note that the formation of the IGZO film, and the tungsten film or the titanium nitride film and the removal of the tungsten film or the titanium nitride film were performed in manners similar to those of the above. The heat treatment was performed at 400° C. under a $N_2$ atmosphere for one hour.

As shown in FIG. 17A, in any of the samples, the resistance of the IGZO film was reduced. Here, in the sample in which the tungsten film was formed over the IGZO film, the resistance of the IGZO film was most reduced in the region close to the surface thereof and up to the greatest depth. This suggests that the tungsten film takes oxygen of the IGZO film thereinto most easily. Further, the behavior of the sample in which the titanium nitride film was formed over the IGZO film was similar to that of the sample in which a conductive film was not formed over the IGZO film. In other words, in the sample in which the tungsten film was formed over the IGZO film, the resistance of the IGZO film was reduced by oxygen of the IGZO film which is taken into the tungsten film, whereas in the sample in which the titanium nitride film was formed over the IGZO film, oxygen released from the IGZO film was transmitted through the titanium nitride film and released to the upper side. This result well accords with the SIMS analysis results shown in Example 1.

Figure 17B:
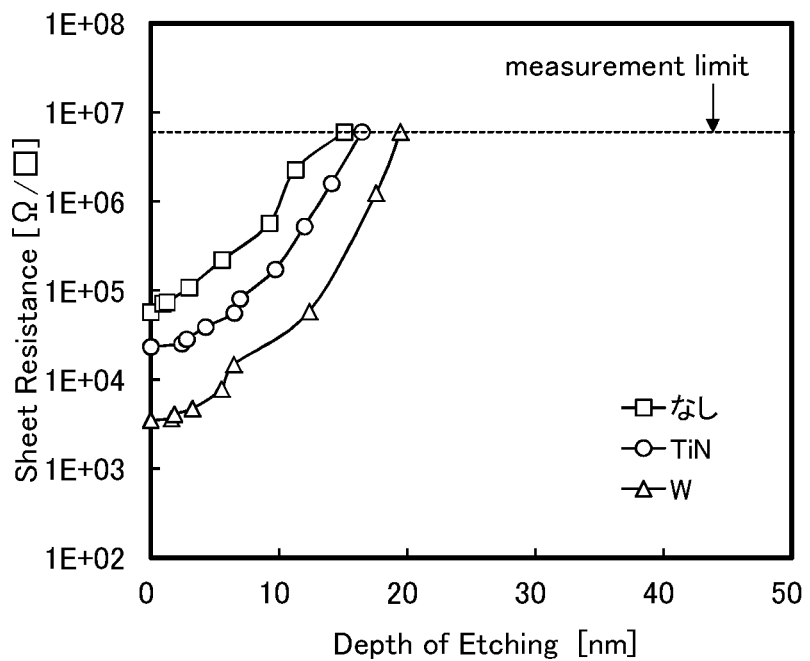

FIG. 17B shows measurement results of sheet resistance values of samples each fabricated as follows with respect to a depth to which an IGZO film was etched: a silicon oxide film was formed by a sputtering method, the IGZO film was formed over the silicon oxide film by a sputtering method, a tungsten film or a titanium nitride film was stacked over the IGZO film by a sputtering method, heat treatment was performed, and then the tungsten film or the titanium nitride film was removed. For comparison, a sample in which a conductive film was not formed over the IGZO film was also fabricated. The silicon oxide film was formed by a reactive sputtering method (a DC sputtering method) with a silicon sputtering target and a 100 percent $O_2$ gas used as a deposition gas. Note that the formation of the IGZO film, and the tungsten film or the titanium nitride film and the removal of the tungsten film or the titanium nitride film were performed in manners similar to those of the above. The heat treatment was performed at 400° C. under a $N_2$ atmosphere for one hour.

As shown in FIG. 17B, a region of the IGZO film, whose resistance was reduced, had a smaller thickness in a thickness direction than that obtained from the results shown in FIG. 17A. This suggests that oxygen was supplied from the silicon oxide film to the IGZO film by the heat treatment and oxygen vacancies in the IGZO film were reduced; accordingly, the resistance of the IGZO film was increased. With the use of a film which is capable of releasing oxygen and provided below the IGZO film in this manner, the thickness of a region of the IGZO film, whose resistance is reduced, can be controlled.

As described above, there were the following findings. A conductive film such as a tungsten film, which easily takes oxygen thereinto, is formed in contact with an IGZO film, so that the resistance of a region of the IGZO film, which is in contact with and close to the conductive film, can be reduced. Moreover, the region of the IGZO film, whose resistance is reduced, can be increased in a depth direction by heat treatment. Further, a film capable of releasing oxygen is formed close to the IGZO film, whereby the thickness of the region whose resistance is reduced can be controlled.

Note that this example can be combined as appropriate with any of embodiments or the other examples in this specification.

Example 3

In this example, a sample in which oxygen is added to an oxide semiconductor film by an ion implantation method was fabricated. Results obtained by thermal desorption spectroscopy (TDS) analysis of the sample and evaluation of the film density thereof will be described.

First, description is made of the fabricated sample. A silicon oxynitride film was formed by a plasma CVD method over a silicon wafer which was subjected to thermal oxidation treatment in an atmosphere containing HCl. Next, a surface of the silicon oxynitride film was subjected to planarization treatment by a CMP method. After that, an IGZO film was formed over the silicon oxynitride film, and an oxygen ion ($O^+$) was added to the IGZO film by an ion implantation method. Here, the IGZO film was formed by a DC sputtering method, using a sputtering target containing In, Ga, and Zn at an atomic ratio of 1:3:2 and a deposition gas containing Ar and $O_2$ at a flow rate ratio of 2:1. The oxygen ion was added under the following conditions: the acceleration voltage was 5 kV and the dose was $1.0 \times 10^{16}$ ions/cm$^2$. Further, a sample to which an oxygen ion was not added was also prepared as a comparative sample.

Figure 18A:
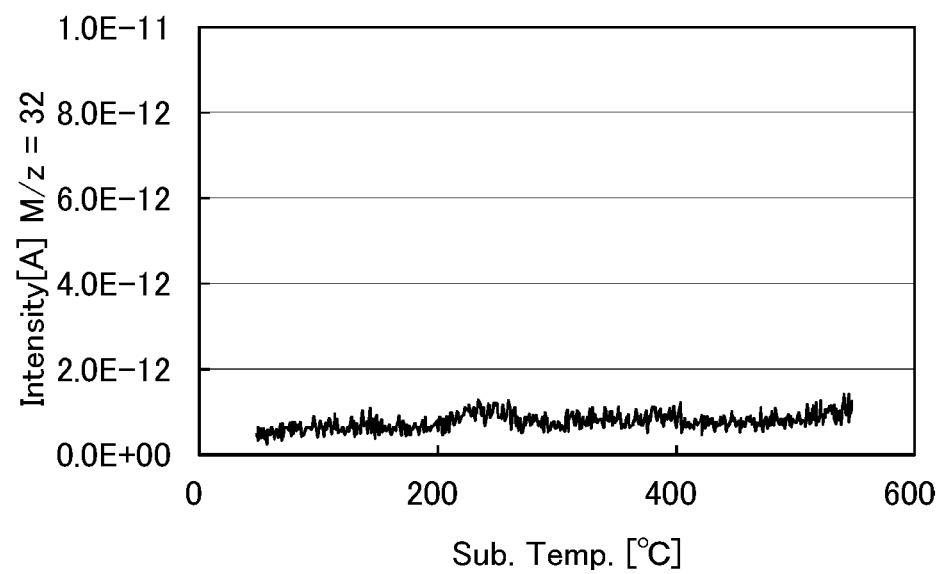
FIGS. 18A and 18B show TDS analysis results.
Figure 18B:
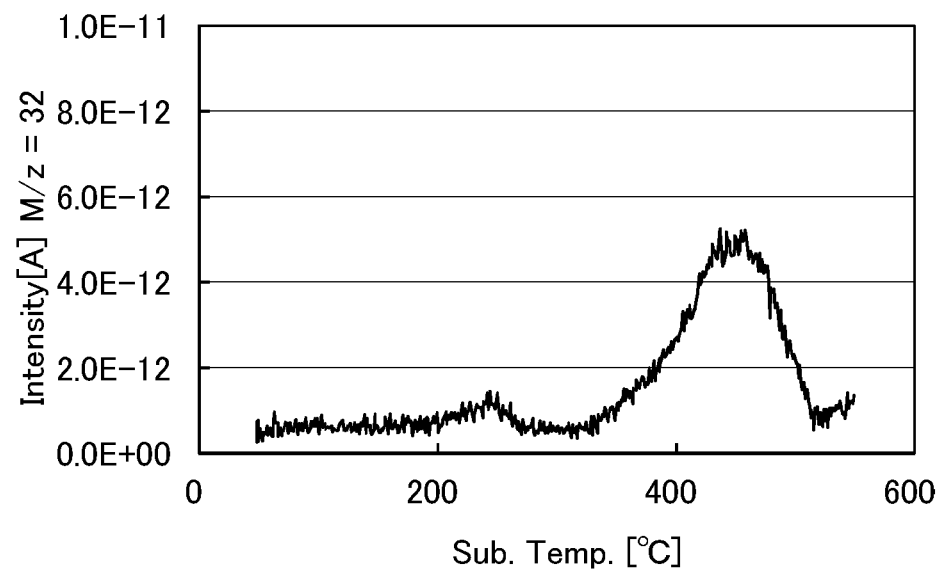

FIG. 18A shows a result obtained by measurement of the amount of a released gas having a mass number of 32 from the sample to which an oxygen ion was not added by TDS analysis. A peak indicating release of the gas having a mass number of 32 was not observed in the range from approximately 50° C. to approximately 550° C. FIG. 18B shows a result obtained by measurement of the amount of a released gas having a mass number of 32 from the sample to which an oxygen ion was added by TDS analysis. A prominent peak indicating release of the gas was observed in the range from approximately 400° C. to approximately 500° C. Accordingly, it was found that when an oxygen ion was added to the oxide semiconductor film, excess oxygen was able to be held in the oxide semiconductor film, and that when the oxide semiconductor film to which an oxygen ion was added was heated, excess oxygen was released from the oxide semiconductor film. Therefore, such an oxide semiconductor film to which oxygen is added is provided in contact with an oxide semiconductor layer where a channel of a transistor is formed and heat treatment is performed on them, whereby oxygen can be effectively supplied from the oxide semiconductor film to which oxygen is added to the oxide semiconductor layer where a channel is formed.

The film densities of the oxide semiconductor films which are a sample to which an oxygen ion was not added and a sample to which an oxygen ion was added were measured by X-ray reflectometry (XRR).

First, description is made of a fabricated sample. A silicon oxynitride film was formed by a plasma CVD method over a silicon wafer which was subjected to thermal oxidation treatment in an atmosphere containing HCl, and an oxygen ion ($O^+$) was added to the silicon oxynitride film by an ion implantation method, and then a surface of the silicon oxynitride film was subjected to planarization treatment by a CMP method. After that, an IGZO film was formed over the silicon oxynitride film, and an oxygen ion ($O^+$) was added to the IGZO film by an ion implantation method. Here, formation of the IGZO film and addition of an oxygen ion to the IGZO film were performed under conditions similar to those above. An oxygen ion was added to the silicon oxynitride film under the following conditions: the acceleration voltage was 60 kV and the dose was $2.0 \times 10^{16}$ ions/cm². For comparison, a sample to which an oxygen ion was not added was also fabricated.

As a result of the measurement of the film densities by XRR, the film density of the sample to which an oxygen ion was not added was 5.8 g/cm³, and the film density of the sample to which an oxygen ion was added was 5.6 g/cm³. Accordingly, it was found that the film density of an oxide semiconductor film was reduced by addition of an oxygen ion. This shows that by addition of an oxygen ion, an oxide semiconductor film can have more disordered atomic arrangement, that is, the oxide semiconductor film can be modified into a prominently amorphous film. In the case where an oxide semiconductor film having crystallinity is stacked over an oxide semiconductor film, for example and the oxide semiconductor film which is a lower layer has a different crystal structure, the crystallinity of the oxide semiconductor film which is an upper layer is lowered in some cases. Even in such a case, an oxygen ion is added to the oxide semiconductor film which is the lower layer so that it becomes amorphous before formation of the oxide semiconductor film which is the upper layer, whereby the oxide semiconductor film which is the upper layer can have improved crystallinity.

Note that this example can be combined as appropriate with any of embodiments or the other examples in this specification.

REFERENCE NUMERALS

200: region, 250: memory cell, 251: memory cell array, 251*a*: memory cell array, 251*b*: memory cell array, 253: peripheral circuit, 254: capacitor, 260: transistor, 262: transistor, 264: capacitor, 302: oxygen, 310: transistor, 320: transistor, 330: transistor, 340: transistor, 350: transistor, 400: substrate, 402: base insulating layer, 404: oxide stack, 404*a*: oxide layer, 404*b*: oxide semiconductor layer, 404*c*: oxide layer, 405: region, 406*a*: source electrode layer, 406*b*: drain electrode layer, 407: oxide stack, 407*a*: oxide layer, 407*b*: oxide semiconductor layer, 407*c*: oxide layer, 408*a*: source electrode layer, 408*b*: drain electrode layer, 410: gate insulating layer, 412: gate electrode layer, 412*a*: gate electrode layer, 412*b*: gate electrode layer, 414: protective insulating layer, 422*a*: electrode layer, 422*b*: electrode layer, 424: interlayer insulating layer, 801: transistor, 802: transistor, 803: transistor, 804: transistor, 811: transistor, 812: transistor, 813: transistor, 814: transistor, 901: RF circuit, 902: analog baseband circuit, 903: digital baseband circuit, 904: battery, 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, 1010: display controller, 9033: fastener, 9034: switch, 9035: power switch, 9036: switch, 9038: operation switch, 9630: housing, 9631*a*: display portion, 9631*b*: display portion, 9632*a*: region, 9632*b*: region, 9633: solar cell, 9634: charge and discharge control circuit, 9635: battery, 9636: DCDC converter, 9638: operation key, 9639: button.

This application is based on Japanese Patent Application serial No. 2012-230365 filed with the Japan Patent Office on Oct. 17, 2012, the entire contents of which are hereby incorporated by reference.

The invention claimed is:

1. A semiconductor device comprising:
a base insulating layer;
a first oxide layer over the base insulating layer;
an oxide semiconductor layer over the first oxide layer;
a second oxide layer over the oxide semiconductor layer;
a first source electrode layer and a first drain electrode layer each of which is in contact with a top surface of the second oxide layer;
a second source electrode layer and a second drain electrode layer over the first source electrode layer and the first drain electrode layer, respectively, and in contact with the top surface of the second oxide layer;
a gate insulating layer over the second source electrode layer and the second drain electrode layer, and in contact with the top surface of the second oxide layer between the second source electrode layer and the second drain electrode layer; and
a gate electrode layer overlapping with the oxide semiconductor layer with the gate insulating layer provided therebetween,
wherein the base insulating layer and the gate insulating layer are in contact with each other.

2. The semiconductor device according to claim 1, wherein the gate electrode layer overlaps with the first source electrode layer and the first drain electrode layer.

3. The semiconductor device according to claim 1, wherein the gate electrode layer does not overlap with the first source electrode layer and the first drain electrode layer.

4. The semiconductor device according to claim 1, wherein the gate electrode layer overlaps with the second source electrode layer and the second drain electrode layer.

5. The semiconductor device according to claim 1, wherein the second source electrode layer and the second drain electrode layer cover the first source electrode layer and the first drain electrode layer, respectively.

6. The semiconductor device according to claim 1,
The first source electrode layer and the first drain electrode layer are in contact with side surfaces of the first oxide layer, the oxide semiconductor layer, and the second oxide layer.

7. The semiconductor device according to claim 1,
wherein the gate electrode layer has a stacked-layer structure.

8. The semiconductor device according to claim 1,
wherein the base insulating layer and the gate insulating layer contains oxygen, and
wherein the second source electrode layer and the second drain electrode layer contains nitrogen.

9. The semiconductor device according to claim 8,
wherein each of the second source electrode layer and the second drain electrode layer is a metal nitride film.

10. The semiconductor device according to claim 1,
wherein the oxide semiconductor layer includes a crystal part, and
wherein a c-axis of the crystal part is parallel to a normal vector of a surface of the oxide semiconductor layer.

11. A semiconductor device comprising:
a base insulating layer;
a first oxide layer over the base insulating layer;
an oxide semiconductor layer over the first oxide layer;
a first source electrode layer and a first drain electrode layer each of which is in contact with a top surface of the oxide semiconductor layer;
a second oxide layer over the first source electrode layer and the first drain electrode layer;
a second source electrode layer and a second drain electrode layer over the second oxide layer;
a gate insulating layer over the second source electrode layer and the second drain electrode layer, and in contact with a top surface of the second oxide layer between the second source electrode layer and the second drain electrode layer; and
a gate electrode layer overlapping with the oxide semiconductor layer with the gate insulating layer provided therebetween,
wherein the base insulating layer and the gate insulating layer are in contact with each other.

12. The semiconductor device according to claim 11,
wherein the gate electrode layer overlaps with the first source electrode layer and the first drain electrode layer.

13. The semiconductor device according to claim 11,
wherein the gate electrode layer does not overlap with the first source electrode layer and the first drain electrode layer.

14. The semiconductor device according to claim 11,
wherein the gate electrode layer overlaps with the second source electrode layer and the second drain electrode layer.

15. The semiconductor device according to claim 11,
wherein the first source electrode layer and the first drain electrode layer are in contact with side surfaces of the first oxide layer and the oxide semiconductor layer.

16. The semiconductor device according to claim 11,
wherein the gate electrode layer has a stacked-layer structure.

17. The semiconductor device according to claim 11,
wherein the base insulating layer and the gate insulating layer contains oxygen, and
wherein the second source electrode layer and the second drain electrode layer contains nitrogen.

18. The semiconductor device according to claim 17,
wherein each of the second source electrode layer and the second drain electrode layer is a metal nitride film.

19. The semiconductor device according to claims 11,
wherein the oxide semiconductor layer includes a crystal part, and
wherein a c-axis of the crystal part is parallel to a normal vector of a surface of the oxide semiconductor layer.

20. The semiconductor device according to claim 11, the semiconductor device further comprising a third source electrode layer and a third drain electrode layer,
wherein the third source electrode layer is in contact with the first source electrode layer through a first contact hole provided in the second oxide layer, the second source electrode layer, and the gate insulating layer, and
wherein the third drain electrode layer is in contact with the first drain electrode layer through a second contact hole provided in the second oxide layer, the second drain electrode layer, and the gate insulating layer.

* * * * *